US012666580B2

(12) United States Patent (10) Patent No.: US 12,666,580 B2
Hattori et al. (45) Date of Patent: \*Jun. 23, 2026

(54) POWER CONVERSION DEVICE

(71) Applicant: Mitsubishi Electric Corporation,
Tokyo (JP)

(72) Inventors: Norikazu Hattori, Tokyo (JP); Kenta
Fujii, Tokyo (JP); Yukiko Mori, Tokyo
(JP); Takashi Kumagai, Tokyo (JP);
Yoshikazu Tsunoda, Tokyo (JP); Yuji
Shirakata, Tokyo (JP)

(73) Assignee: Mitsubishi Electric Corporation,
Tokyo (JP)

( \* ) Notice: Subject to any disclaimer, the term of this
patent is extended or adjusted under 35
U.S.C. 154(b) by 276 days.

This patent is subject to a terminal dis-
claimer.

(21) Appl. No.: 18/700,190

(22) PCT Filed: Sep. 7, 2022

(86) PCT No.: PCT/JP2022/033548
§ 371 (c)(1),
(2) Date: Apr. 10, 2024

(87) PCT Pub. No.: WO2023/067932
PCT Pub. Date: Apr. 27, 2023

(65) Prior Publication Data
US 2024/0422952 A1 Dec. 19, 2024

(30) Foreign Application Priority Data
Oct. 19, 2021 (JP) ................................ 2021-170872

(51) Int. Cl.
H05K 7/20 (2006.01)
H02M 7/00 (2006.01)
H05K 5/02 (2006.01)

(52) U.S. Cl.
CPC ............ H05K 7/209 (2013.01); H02M 7/003
(2013.01); H05K 5/0217 (2013.01)

(58) Field of Classification Search
CPC ........ H02M 7/003; H02M 1/00; H02M 3/003;
H01G 2/08; H01G 2/10; H01G 2/02;
(Continued)

(56) References Cited

U.S. PATENT DOCUMENTS 4,591,090 A \* 5/1986 Collins .............. B65D 5/48038
229/120.36
11,330,742 B2 \* 5/2022 Yamashima ........... H05K 7/209
(Continued)

FOREIGN PATENT DOCUMENTS

JP S63250759 A 10/1988
JP H0595842 U \* 12/1993
(Continued)

OTHER PUBLICATIONS

Murakami Akinobu, Capacitor Module, Jun. 26, 2014, PE2E Search
Translation (Year: 2014).\*
(Continued)

*Primary Examiner* — Michael A Matey
(74) *Attorney, Agent, or Firm* — Buchanan Ingersoll &
Rooney PC

(57) ABSTRACT

A power conversion device includes: a case having a side
wall and a bottom wall; a plurality of first heat dissipation
plates, a plurality of second heat dissipation plates, a plu-
rality of circuit components and a sealing material that are
disposed in the case; and a printed wiring board electrically
connected to the plurality of circuit components and
attached to the case. An inner wall surface of the bottom wall
has a normal along a first direction. The plurality of first heat
dissipation plates each extend in a second direction orthogo-
nal to the first direction, and are spaced from one another and
(Continued)

arranged in a third direction orthogonal to the first direction and the second direction. The plurality of second heat dissipation plates each extend in the third direction, and are spaced from one another and arranged in the second direction.

14 Claims, 35 Drawing Sheets

(58) Field of Classification Search
CPC .......... H01G 4/38; H01G 11/10; H01G 11/18; H01G 11/78; H01G 11/82; H01G 2/106; H01G 9/0003; H01G 9/08; H01G 9/26; H05K 7/209; H05K 2201/066; H05K 5/0217; H05K 1/184; H05K 2203/1147; H05K 7/20409; H05K 7/20509; H05K 1/02; H05K 1/0203; H05K 1/0209; H05K 1/144; H05K 1/0306; H05K 1/181; H05K 2201/042; H05K 2203/1327; H05K 3/0061; H05K 3/284; H05K 5/0208; H05K 5/30; H05K 7/2039; H05K 7/20963; H05K 9/0037; H01L 23/367; H01L 2221/68345; H01L 2221/68359; H01L 2224/47; H01L 2224/48247; H01L 23/28; H01L 23/3121; H01L 23/36; H01L 23/3735; H01L 2924/181; B65D 5/6629
See application file for complete search history.

(56) References Cited

U.S. PATENT DOCUMENTS

| | | | |
|---|---|---|---|
| 2002/0108011 A1 | 8/2002 | Tanha | |
| 2016/0241155 A1 | 8/2016 | Takeuchi et al. | |
| 2018/0019062 A1 | 1/2018 | Okuzuka et al. | |
| 2018/0143917 A1 | 5/2018 | Flachs et al. | |
| 2021/0037675 A1 | 2/2021 | Yamashima et al. | |
| 2022/0264769 A1 * | 8/2022 | Kishiwada | H05K 7/20509 |

FOREIGN PATENT DOCUMENTS

| | | | | |
|---|---|---|---|---|
| JP | 10116756 | A | * | 5/1998 |
| JP | H10-116756 | A | | 5/1998 |
| JP | 2002232508 | A | | 8/2002 |
| JP | 2005167663 | A | | 6/2005 |
| JP | 2006012948 | A | | 1/2006 |
| JP | 3778383 | B2 | * | 5/2006 |
| JP | 2010-132299 | A | | 6/2010 |
| JP | 4512208 | B2 | * | 7/2010 |
| JP | 2013058868 | A | | 3/2013 |
| JP | 2013059191 | A | | 3/2013 |
| JP | 2014090562 | A | | 5/2014 |
| JP | 2014116400 | A | * | 6/2014 |
| JP | 2015138880 | A | | 7/2015 |
| JP | 2016000983 | A | | 1/2016 |
| JP | 2016066666 | A | | 4/2016 |
| JP | 2016139778 | A | | 8/2016 |
| JP | 2016149906 | A | | 8/2016 |
| JP | 2016218943 | A | | 12/2016 |
| JP | 2018073884 | A | | 5/2018 |
| JP | 2018085104 | A | | 5/2018 |
| JP | 2020162226 | A | | 10/2020 |
| JP | 6961047 | B1 | | 10/2021 |
| JP | 7048959 | B2 | * | 4/2022 |
| WO | 2019208250 | A1 | | 10/2019 |

OTHER PUBLICATIONS

Honda Motor Co, Aluminium Electrolytic Capacitor has Several Charging Electricity Units Which are Provided in Container by Inserting Several Plates and Electrolyte Into Respective Chambers of Container, May 6, 1998, PE2E Search Translation (Year: 1998).*

International Search Report (PCT/ISA/210) with translation and Written Opinion (PCT/ISA/237) mailed Nov. 22, 2022, by the Japan Patent Office as the International Searching Authority for International Application No. PCT/JP2022/033269. (9 pages).

International Search Report (PCT/ISA/210) with translation and Written Opinion (PCT/ISA/237) mailed on Aug. 30, 2022, by the Japan Patent Office as the International Searching Authority for International Application No. PCT/JP2022/023770. (8 pages).

International Search Report (PCT/ISA/210) with translation and Written Opinion (PCT/ISA/237) mailed on Aug. 30, 2022, by the Japanese Patent Office as the International Searching Authority for International Application No. PCT/JP2022/023769. (8 pages).

International Search Report (PCT/ISA/210) with translation and Written Opinion (PCT/ISA/237) mailed on Nov. 22, 2023, by the Japan Patent Office as the International Searching Authority for International Application No. PCT/JP2022/034413. (8 pages).

International Search Report (PCT/ISA/210) with translation and Written Opinion (PCT/ISA/237) mailed on Nov. 8, 2022, by the Japan Patent Office as the International Searching Authority for International Application No. PCT/JP2022/033548. (11 pages).

Yoshikazu Tsunoda et al., "Circuit Device", U.S. Appl. No. 18/559,574, filed in the U.S. Patent and Trademark Office Nov. 8, 2023.

Yoshimichi Saito et al., "Circuit Device", U.S. Appl. No. 18/559,943, filed in the U.S. Patent and Trademark Office Nov. 9, 2023.

Yukiko Mori et al., "Power Conversion Device and Method of Manufacturing Power Conversion Device", U.S. Appl. No. 18/692,178, filed in the U.S. Patent and Trademark Office Mar. 14, 2024.

* cited by examiner

POWER CONVERSION DEVICE

TECHNICAL FIELD

The present disclosure relates to a power conversion device.

BACKGROUND ART

Japanese Patent Laying-Open No. 2016-66666 (PTL 1) describes a capacitor. The capacitor described in PTL 1 includes a case, a capacitor element, an electrode plate, a molding resin, and a lid body. The capacitor element and the electrode plate are housed in the case. The capacitor element has a lead terminal electrically connected to the electrode plate. The molding resin fills the case. Thus, the capacitor element and the electrode plate are sealed in the case. The lid body is attached to an opening in the case.

CITATION LIST

Patent Literature

PTL 1: Japanese Patent Laying-Open No. 2016-66666

SUMMARY OF INVENTION

Technical Problem

In the capacitor described in PTL 1, heat generated in the capacitor element is transferred through the lead terminal and the electrode plate to the lid body, and dissipated from a protrusion of the lid body. Thus, the capacitor described in PTL 1 has a high thermal resistance, and the temperature rise in the capacitor element increases.

The present disclosure has been made in view of such a problem with conventional techniques. More specifically, the present disclosure provides a power conversion device that can suppress a temperature rise in circuit components.

Solution to Problem

A power conversion device of the present disclosure includes: a case having a side wall and a bottom wall; a plurality of first heat dissipation plates, a plurality of second heat dissipation plates, a plurality of circuit components and a sealing material that are disposed in the case; and a printed wiring board electrically connected to the plurality of circuit components and attached to the case. An inner wall surface of the bottom wall has a normal along a first direction. The plurality of first heat dissipation plates each extend in a second direction orthogonal to the first direction, and are spaced from one another and arranged in a third direction orthogonal to the first direction and the second direction. The plurality of second heat dissipation plates each extend in the third direction, and are spaced from one another and arranged in the second direction. Each of the plurality of circuit components is disposed in a space defined by two adjacent ones of the plurality of first heat dissipation plates, two adjacent ones of the plurality of second heat dissipation plates and the bottom wall. The sealing material fills the space.

Advantageous Effects of Invention

According to the power conversion device of the present disclosure, a temperature rise in the circuit components can be suppressed.

BRIEF DESCRIPTION OF DRAWINGS

FIG. 13 is an enlarged cross-sectional view of power conversion device 100A in the vicinity of a third groove 32a.

FIG. 15 is an enlarged cross-sectional view of a power conversion device 100B in the vicinity of third groove 32a.

FIG. 20 is an enlarged cross-sectional view of a power conversion device 100C in the vicinity of third groove 32a.

DESCRIPTION OF EMBODIMENTS

Figure 1:
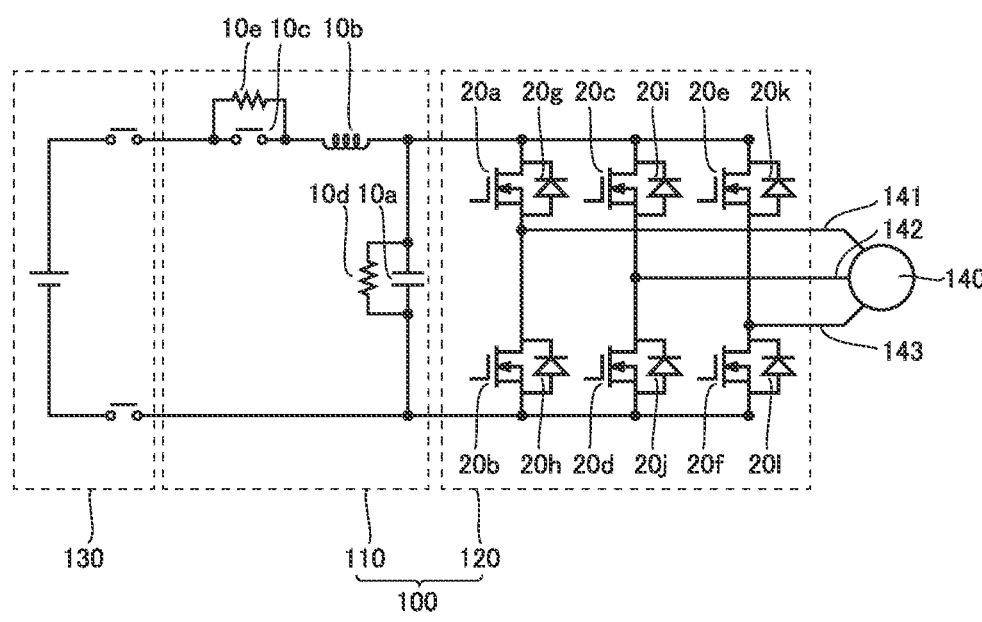
FIG. 1 is a circuit diagram of a power conversion device 100.

Embodiments of the present disclosure are described in detail with reference to the drawings. In the following drawings, the same or corresponding parts are denoted by the same reference characters, and the same description will not be repeated.

Embodiment 1

A power conversion device according to Embodiment 1 is described. The power conversion device according to Embodiment 1 is referred to as a power conversion device 100.
(Configuration of Power Conversion Device 100)

The configuration of power conversion device 100 is described below.

FIG. 1 is a circuit diagram of power conversion device 100. As shown in FIG. 1, power conversion device 100 includes a peripheral circuit 110 and a switching circuit 120.

Peripheral circuit 110 includes a plurality of circuit components 10. In the example shown in FIG. 1, the plurality of circuit components 10 are a capacitor 10a, an inductor 10b, a contactor 10c, a discharge resistor 10d and a charge resistor 10e. Capacitor 10a, inductor 10b and contactor 10c are connected in series. Inductor 10b is disposed between capacitor 10a and contactor 10c. Discharge resistor 10d and charge resistor 10e are connected in parallel to capacitor 10a and contactor 10c, respectively. Peripheral circuit 110 is connected to a DC supply circuit 130.

Switching circuit 120 is a three-phase inverter circuit, for example. Switching circuit 120 includes a plurality of circuit components 20. In the example shown in FIG. 1, the plurality of circuit components 20 are transistors 20a to 20f and diodes 20g to 20l.

Transistor 20a has a drain electrically connected to one electrode of capacitor 10a. Transistor 20a has a source electrically connected to a drain of transistor 20b. Transistor 20b has a source electrically connected to the other electrode of capacitor 10a.

Diode 20g has an anode electrically connected to the source of transistor 20a. Diode 20g has a cathode electrically connected to the drain of transistor 20a. Diode 20h has an anode electrically connected to the source of transistor 20b. Diode 20h has a cathode electrically connected to the drain of transistor 20b.

Note that transistor 20c, transistor 20d, diode 20i and diode 20j are connected in a similar manner to transistor 20a, transistor 20b, diode 20g and diode 20h, respectively. Transistor 20e, transistor 20f, diode 20k and diode 20l are connected in a similar manner to transistor 20a, transistor 20b, diode 20g and diode 20h, respectively. Although not shown, transistors 20a to 20f each have a gate connected to a control circuit.

Switching circuit 120 is connected to a motor 140. Motor 140 is a three-phase motor, for example. Motor 140 includes input lines 141, 142 and 143. Input line 141 is electrically connected to the source of transistor 20a and the drain of transistor 20b. Input line 142 is electrically connected to a source of transistor 20c and a drain of transistor 20d. Input line 143 is electrically connected to a source of transistor 20e and a drain of transistor 20f.

Figure 2:
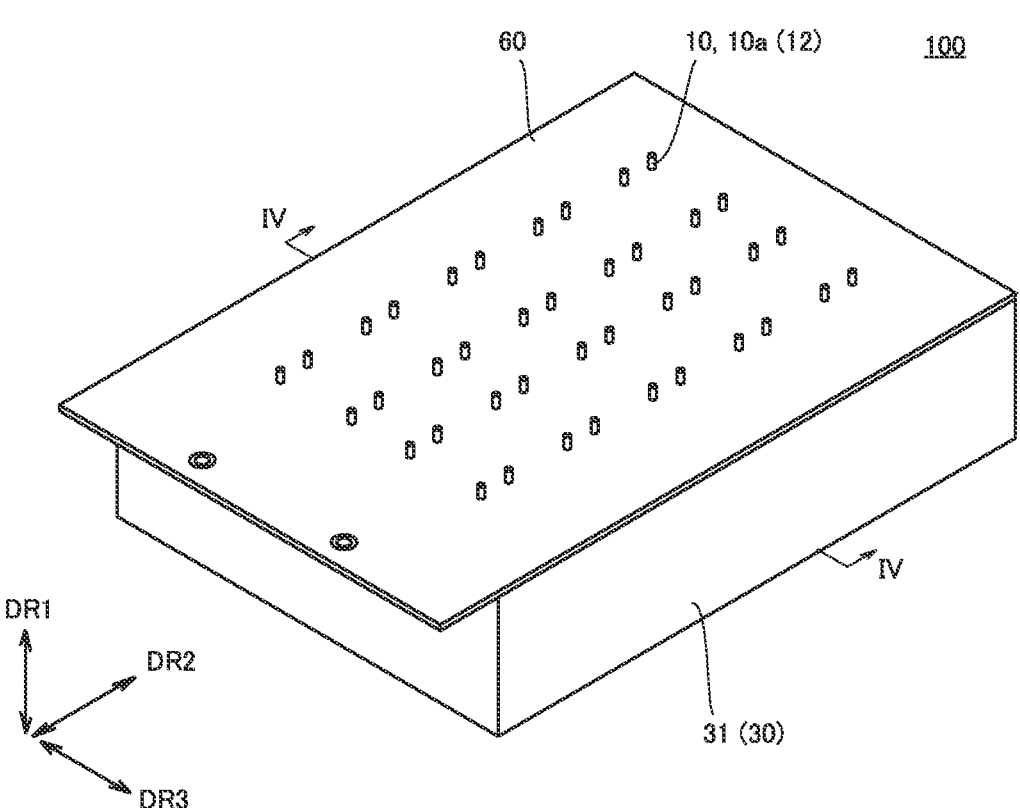
FIG. 2 is a perspective view of power conversion device 100.
Figure 3:
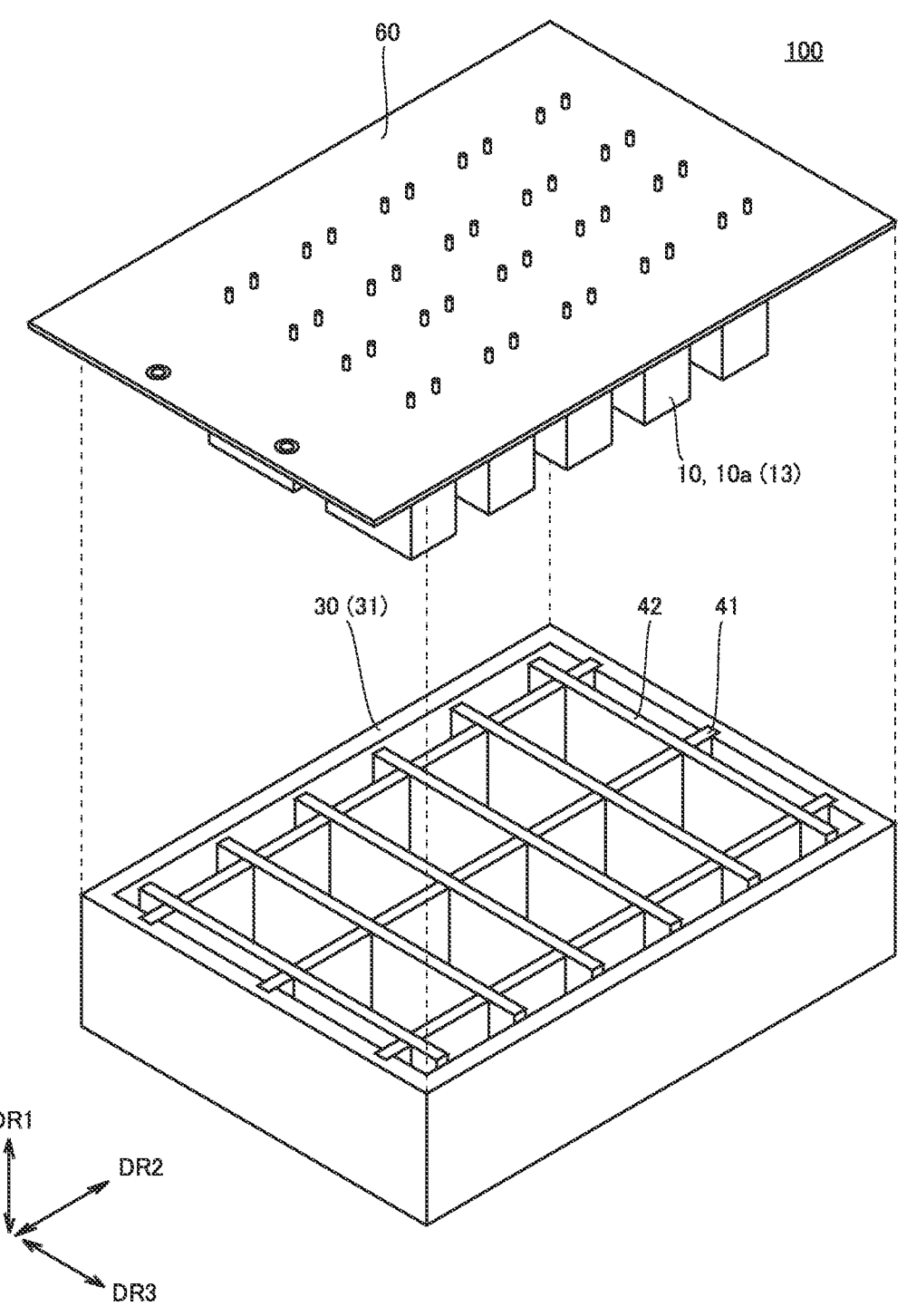
FIG. 3 is an exploded perspective view of power conversion device 100.
Figure 4:
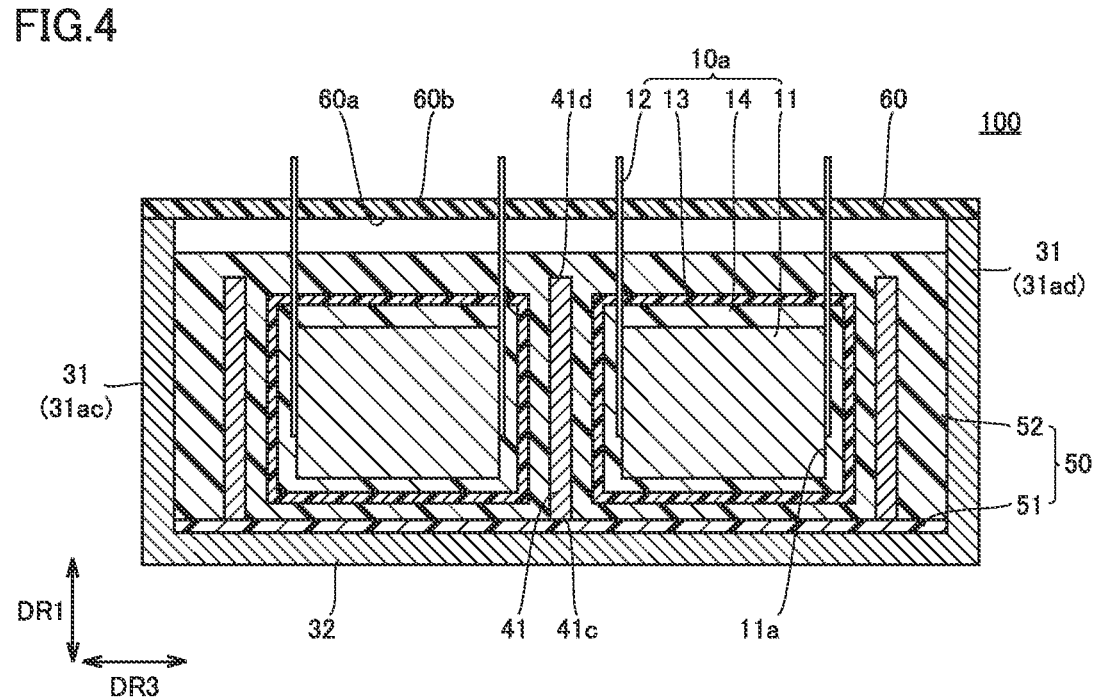
FIG. 4 is a cross-sectional view along the line IV-IV in FIG. 2.
Figure 5:
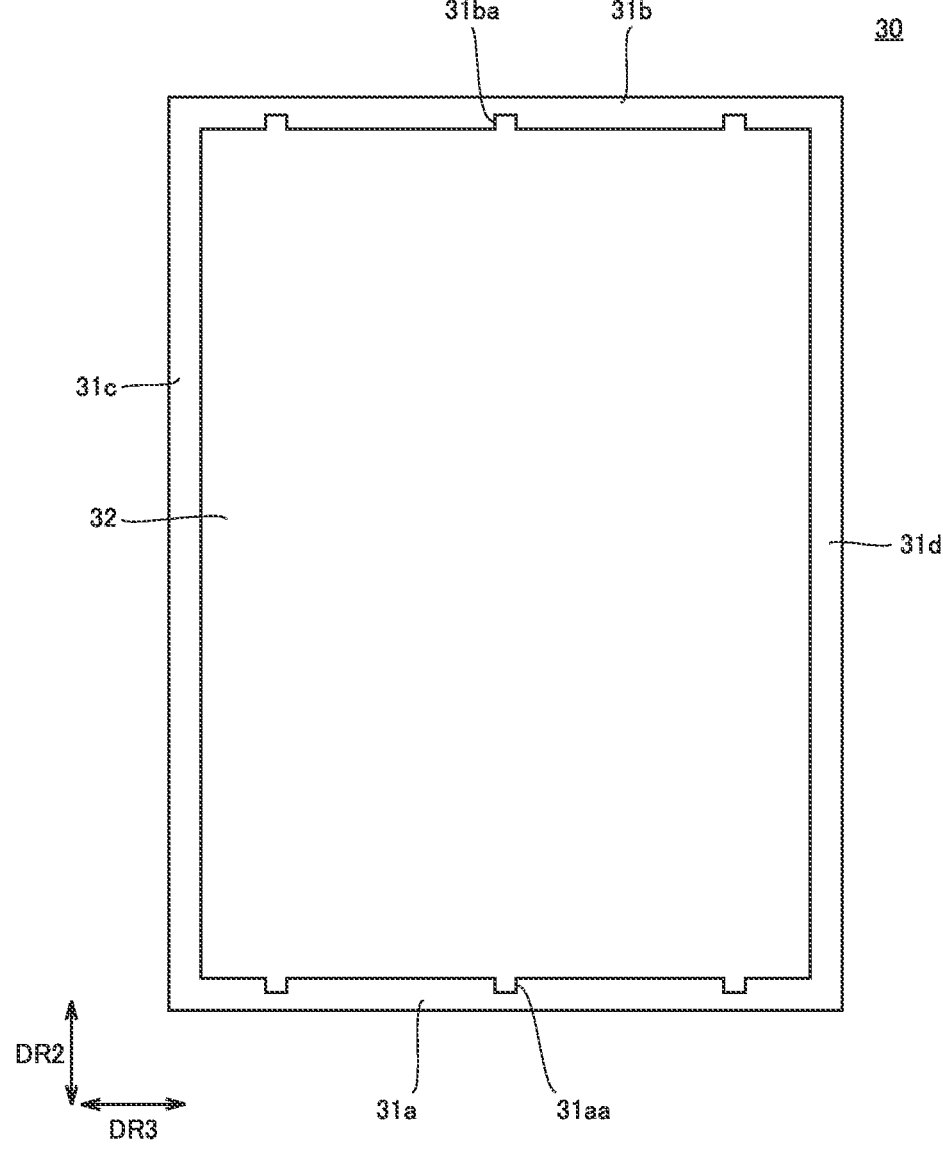
FIG. 5 is a plan view of a case 30 included in power conversion device 100.
Figure 6:
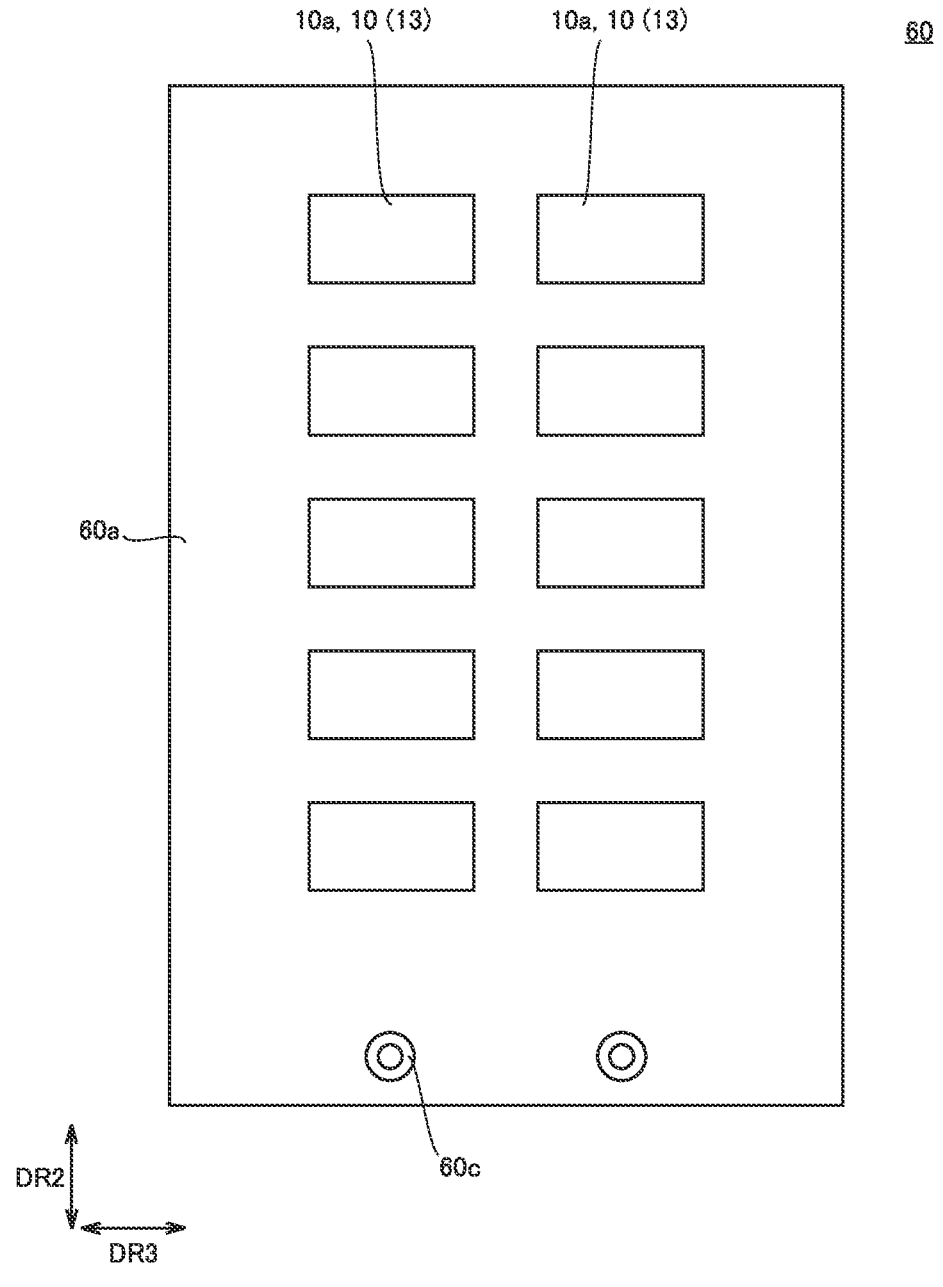
FIG. 6 is a bottom view of a printed wiring board 60 included in power conversion device 100.
Figure 7:
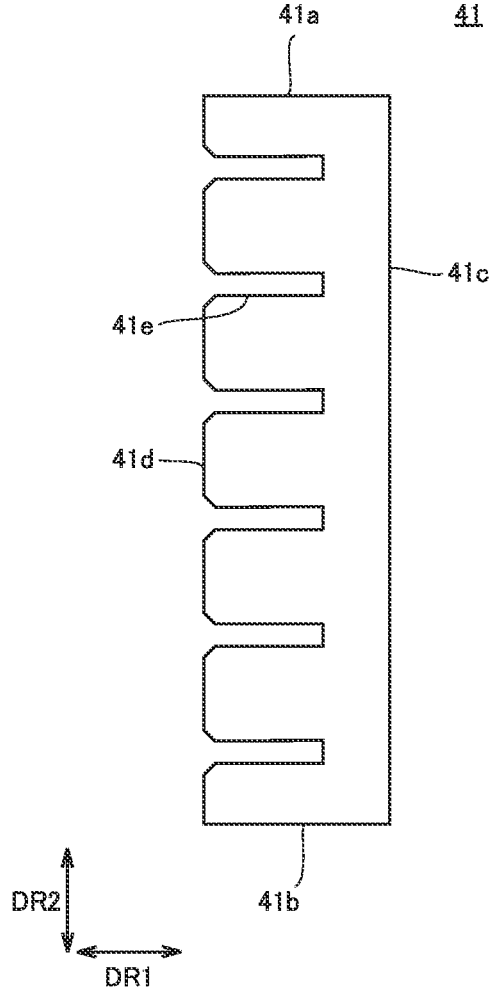
FIG. 7 is a side view of a first heat dissipation plate 41 included in power conversion device 100.
Figure 8:
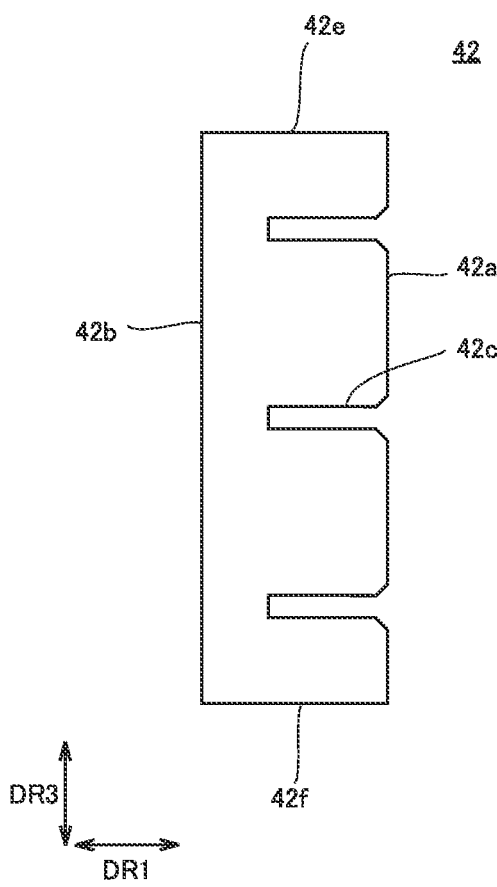
FIG. 8 is a side view of a second heat dissipation plate 42 included in power conversion device 100.

FIG. 2 is a perspective view of power conversion device 100. FIG. 3 is an exploded perspective view of power conversion device 100. FIG. 4 is a cross-sectional view along the line IV-IV in FIG. 2. FIG. 5 is a plan view of a case 30 included in power conversion device 100. FIG. 6 is a bottom view of a printed wiring board 60 included in power conversion device 100. FIG. 7 is a side view of a first heat dissipation plate 41 included in power conversion device 100. FIG. 8 is a side view of a second heat dissipation plate 42 included in power conversion device 100. As shown in FIGS. 2 to 8, power conversion device 100 includes the plurality of circuit components 10, case 30, a plurality of first heat dissipation plates 41, a plurality of second heat dissipation plates 42, a sealing material 50, and printed wiring board 60.

Case 30 has a side wall 31 and a bottom wall 32. A direction along the normal of an inner wall surface of bottom wall 32 is referred to as a first direction DR1. A direction orthogonal to first direction DR1 is referred to as a second direction DR2. A direction orthogonal to first direction DR1 and second direction DR2 is referred to as a third direction DR3.

Side wall 31 has a rectangular shape, for example, in a plan view. Side wall 31 has a first side wall portion 31a, a second side wall portion 31b, a third side wall portion 31c and a fourth side wall portion 31d. First side wall portion 31a and second side wall portion 31b are spaced from each other and face each other in second direction DR2. Third side wall portion 31c and fourth side wall portion 31d are spaced from each other and face each other in third direction DR3. An inner wall surface of side wall 31 has an arithmetic average roughness of preferably 6.3 μm or more. Bottom wall 32 is continuous to a lower end of side wall 31.

Case 30 is made of a rigid material. Case 30 is made of a metal material, for example. Case 30 is made of copper (Cu), a copper alloy, aluminum (Al), an aluminum alloy, iron (Fe) and an iron alloy, etc. Case 30 may be made of a resin material.

An inner wall surface of first side wall portion 31a is provided with a plurality of first grooves 31aa. The plurality of first grooves 31aa are spaced from one another in third direction DR3. First groove 31aa extends in first direction DR1. Both ends of first groove 31aa in third direction DR3 reach an upper end and a lower end of first side wall portion 31a, respectively.

An inner wall surface of second side wall portion 31b is provided with a plurality of second grooves 31ba. The plurality of second grooves 31ba are spaced from one another in third direction DR3. Second groove 31ba extends in first direction DR1. Both ends of second groove 31ba in third direction DR3 reach an upper end and a lower end of second side wall portion 31b, respectively. Second groove 31ba faces first groove 31aa in second direction DR2.

First heat dissipation plate 41 and second heat dissipation plate 42 are disposed in case 30. More specifically, first heat dissipation plate 41 and second heat dissipation plate 42 are disposed in a space defined by side wall 31 and bottom wall 32. First heat dissipation plate 41 and second heat dissipation plate 42 are made of a material having a high thermal conductivity. First heat dissipation plate 41 and second heat dissipation plate 42 are made of, for example, copper, a copper alloy, aluminum, an aluminum alloy, iron, an iron alloy, etc. First heat dissipation plate 41 and second heat dissipation plate 42 may be made of the same material or different materials. Side surfaces of first heat dissipation plate 41 and second heat dissipation plate 42 each have an arithmetic average roughness of preferably 6.3 μm or more.

First heat dissipation plate 41 extends in second direction DR2 in a plan view. The plurality of first heat dissipation plates 41 are spaced from one another and arranged in third direction DR3. First heat dissipation plate 41 has a first end 41*a* and a second end 41*b* in second direction DR2. Second end 41*b* is located opposite to first end 41*a*. First heat dissipation plate 41 is attached to case 30 by first end 41*a* and second end 41*b* being inserted into first groove 31*aa* and second groove 31*ba*, respectively. First heat dissipation plate 41 faces an electrode surface 11*a*.

First heat dissipation plate 41 has a third end 41*c* and a fourth end 41*d* in first direction DR1. Third end 41*c* is located close to bottom wall 32. Third end 41*c* is thermally connected to bottom wall 32 with a heat dissipation auxiliary material 51 (described later) interposed therebetween. Fourth end 41*d* is located opposite to third end 41*c*. First heat dissipation plate 41 is provided with a plurality of first insertion slots 41*e*. First insertion slot 41*e* passes through first heat dissipation plate 41 in the thickness direction. First insertion slot 41*e* extends from fourth end 41*d* toward third end 41*c*. The number of first insertion slots 41*e* is greater than or equal to the number of second heat dissipation plates 42.

Second heat dissipation plate 42 extends in third direction DR3 in a plan view. The plurality of second heat dissipation plates 42 are spaced from one another and arranged in second direction DR2. Second heat dissipation plate 42 has a fifth end 42*a* and a sixth end 42*b* in first direction DR1. Fifth end 42*a* is located close to bottom wall 32. Sixth end 42*b* is located opposite to fifth end 42*a*.

Second heat dissipation plate 42 is provided with a plurality of second insertion slots 42*c*. Second insertion slot 42*c* passes through second heat dissipation plate 42 in the thickness direction. Second insertion slot 42*c* extends from fifth end 42*a* toward sixth end 42*b*. Note that the number of second insertion slots 42*c* is greater than or equal to the number of first heat dissipation plates 41. Second heat dissipation plate 42 is attached to first heat dissipation plate 41 by second insertion slot 42*c* being inserted into first insertion slot 41*e*. First heat dissipation plates 41 and second heat dissipation plates 42 are assembled in a number sign pattern (in a grid) in a plan view.

Although not shown, an inner wall surface of third side wall portion 31*c* may be provided with a plurality of grooves which extend in first direction DR1 and which are spaced from one another in second direction DR2. An inner wall surface of fourth side wall portion 31*d* may be provided with a plurality of grooves which extend in first direction DR1 and which are spaced from one another in second direction DR2. Second heat dissipation plate 42 may be attached to case 30 by both ends of second heat dissipation plate 42 in third direction DR3 being inserted into the groove formed in the inner wall surface of third side wall portion 31*c* and the groove formed in the inner wall surface of fourth side wall portion 31*d*, respectively.

Second heat dissipation plate 42 has a seventh end 42*e* and an eighth end 42*f* in third direction DR3. Eighth end 42*f* is located opposite to seventh end 42*e*. Seventh end 42*e* and eighth end 42*f* are preferably located away from the inner wall surface of third side wall portion 31*c* and the inner wall surface of fourth side wall portion 31*d*, respectively. From a different viewpoint, a molding material 52 is preferably disposed between seventh end 42*e* and the inner wall surface of third side wall portion 31*c*, and between eighth end 42*f* and the inner wall surface of fourth side wall portion 31*d*.

Note that when electrode surface 11*a* faces second heat dissipation plate 42 instead of first heat dissipation plate 41, the inner wall surface of third side wall portion 31*c* may be provided with a groove into which seventh end 42*e* is inserted, and the inner wall surface of fourth side wall portion 31*d* may be provided with a groove into which eighth end 42*f* is inserted, instead of first groove 31*aa* and second groove 31*ba*.

In the example shown in FIGS. 2 to 8, circuit component 10 is capacitor 10*a*. Capacitor 10*a* is disposed in a space defined by two adjacent first heat dissipation plates 41, two adjacent second heat dissipation plates 42 and bottom wall 32.

Capacitor 10*a* is a film capacitor, for example. Circuit component 10 includes an element body and a lead wire. When circuit component 10 is capacitor 10*a*, the element body is a capacitor element body 11, and the lead wire is a lead wire 12. Capacitor 10*a* further includes an exterior case 13 and a sealing resin 14.

Capacitor element body 11 is formed, for example, by winding a metal film and a dielectric film disposed on the metal film. Capacitor element body 11 has both end surfaces that are each formed as electrode surface 11*a*. Lead wire 12 is electrically connected to electrode surface 11*a*. Lead wire 12 serves to cause a current received from outside to flow through capacitor element body 11. Lead wire 12 is made of a conductive material such as a metal material.

Capacitor element body 11 has two electrode surfaces 11*a*. Two electrode surfaces 11*a* face two different first heat dissipation plates 41, respectively, with molding material 52 interposed therebetween.

Exterior case 13 is made of an insulating material. Exterior case 13 is made of a resin material, for example. Capacitor element body 11 and lead wire 12 are housed in exterior case 13. Note that lead wire 12 partially protrudes from an upper surface of exterior case 13. Sealing resin 14 fills exterior case 13.

A plurality of capacitors 10*a* are arranged in a first row and a second row. The first row and the second row extend in second direction DR2. Electrode surface 11*a* of capacitor 10*a* belonging to the first row preferably faces electrode surface 11*a* of capacitor 10*a* belonging to the second row. First heat dissipation plate 41 is disposed between the first row and the second row. In other words, electrode surface 11*a* of capacitor 10*a* belonging to the first row faces electrode surface 11*a* of capacitor 10*a* belonging to the second row, with first heat dissipation plate 41 interposed therebetween.

Sealing material 50 fills case 30. More specifically, sealing material 50 fills the space defined by two adjacent first heat dissipation plates 41, two adjacent second heat dissipation plates 42 and bottom wall 32. Sealing material 50 includes heat dissipation auxiliary material 51 and molding material 52.

Heat dissipation auxiliary material 51 is, for example, a resin material such as silicone resin, epoxy resin or urethane resin, grease, gel, or an insulating sheet. Heat dissipation auxiliary material 51 may contain a thermally conductive filler. The thermally conductive filler is made of ceramics or a metal material, for example. Heat dissipation auxiliary material 51 has a thermal conductivity of 1 W/m·K or more and several tens of W/m·K or less, for example. Heat dissipation auxiliary material 51 is applied onto bottom wall 32. More specifically, heat dissipation auxiliary material 51 is applied onto the inner wall surface of bottom wall 32. Although not shown, heat dissipation auxiliary material 51 may also be applied onto first groove 31*aa* and second groove 31*ba*.

Molding material 52 is, for example, a resin material having a high thermal conductivity. Molding material 52 is, for example, epoxy resin, silicone resin or urethane resin, etc. containing a thermally conductive filler. Molding material 52 has a thermal conductivity of 0.1 W/m·K or more and 20 W/m·K or less, for example. Molding material 52 has a Young's modulus of 1 MPa or more and 50 GPa or less, for example. Molding material 52 may be the same material as heat dissipation auxiliary material 51. For example, heat dissipation auxiliary material 51 and molding material 52 may be an adhesive.

Molding material 52 is disposed on heat dissipation auxiliary material 51. Molding material 52 is in contact with a bottom surface, a side surface and a top surface of exterior case 13. In other words, molding material 52 surrounds capacitor 10*a*. Note that lead wire 12 protrudes from molding material 52. Molding material 52 is also in contact with the inner wall surface of side wall 31, the side surface of first heat dissipation plate 41 and the side surface of second heat dissipation plate 42.

Printed wiring board 60 has a first surface 60*a* and a second surface 60*b*. First surface 60*a* faces case 30. Second surface 60*b* is located opposite to first surface 60*a*. Capacitor 10*a* is electrically connected to printed wiring board 60. More specifically, capacitor 10*a* is connected to printed wiring board 60 by lead wire 12 being inserted into and soldered to a through hole (not shown) formed in printed wiring board 60. Thus, wiring of peripheral circuit 110 shown in FIG. 1 is implemented. Note that capacitor 10*a* and printed wiring board 60 may be connected with a conductive adhesive.

Printed wiring board 60 also has an external connection terminal 60*c*. External connection terminal 60*c* is formed of a land, and is connected to switching circuit 120 shown in FIG. 1 by being energized through contact with a busbar (not shown). Printed wiring board 60 is attached to an upper end of side wall 31.

Figure 9:
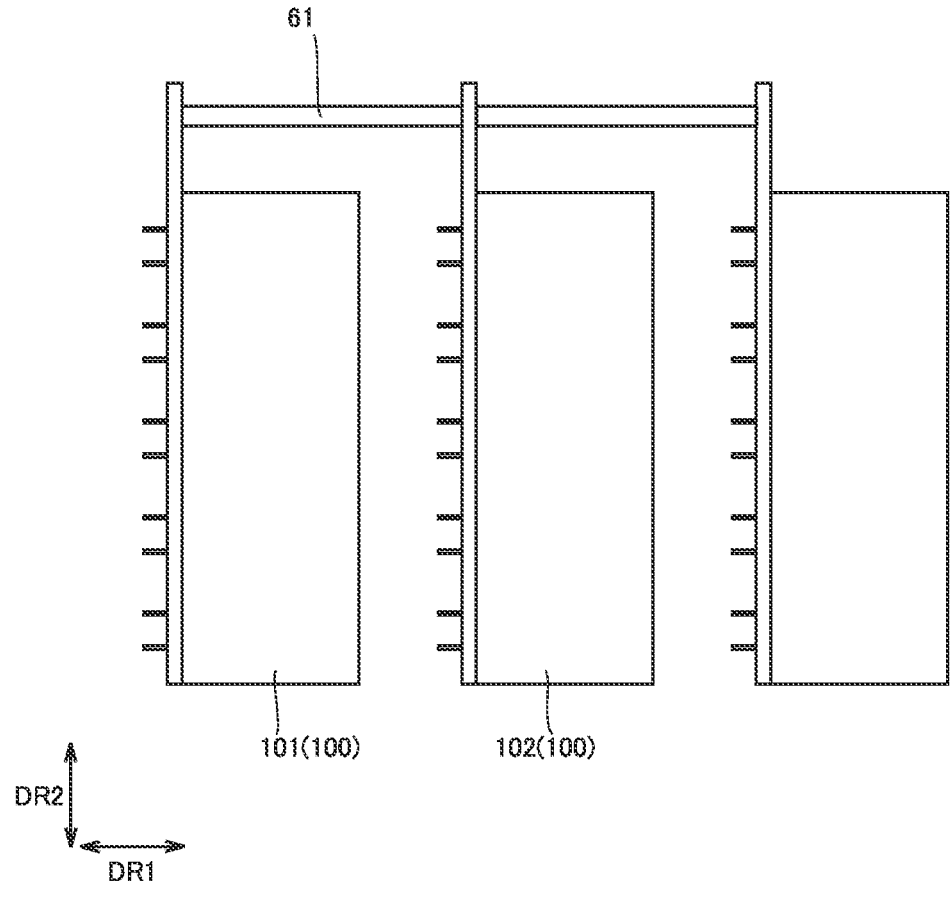
FIG. 9 is a schematic side view during connection of a plurality of power conversion devices 100.

FIG. 9 is a schematic side view during connection of a plurality of power conversion devices 100. One of the plurality of power conversion devices 100 is referred to as a power conversion device 101, and another one of the plurality of power conversion devices 100 is referred to as a power conversion device 102. As shown in FIG. 9, power conversion device 101 and power conversion device 102 are connected by a connection member 61. Connection member 61 is connected on one end to external connection terminal 60*c* of printed wiring board 60 included in power conversion device 101, and is connected on the other end to external connection terminal 60*c* of printed wiring board 60 included in power conversion device 102. Connection member 61 is, for example, a rolled material made of a metal material.

While there are three power conversion devices 100 in FIG. 9, the number of power conversion devices 100 connected can be increased or decreased. While the plurality of power conversion devices 100 are connected in first direction DR1 in the example shown in FIG. 9, the plurality of power conversion devices 100 may be connected in second direction DR2 or third direction DR3.

<Modification 1 of Power Conversion Device 100>

Figure 10:
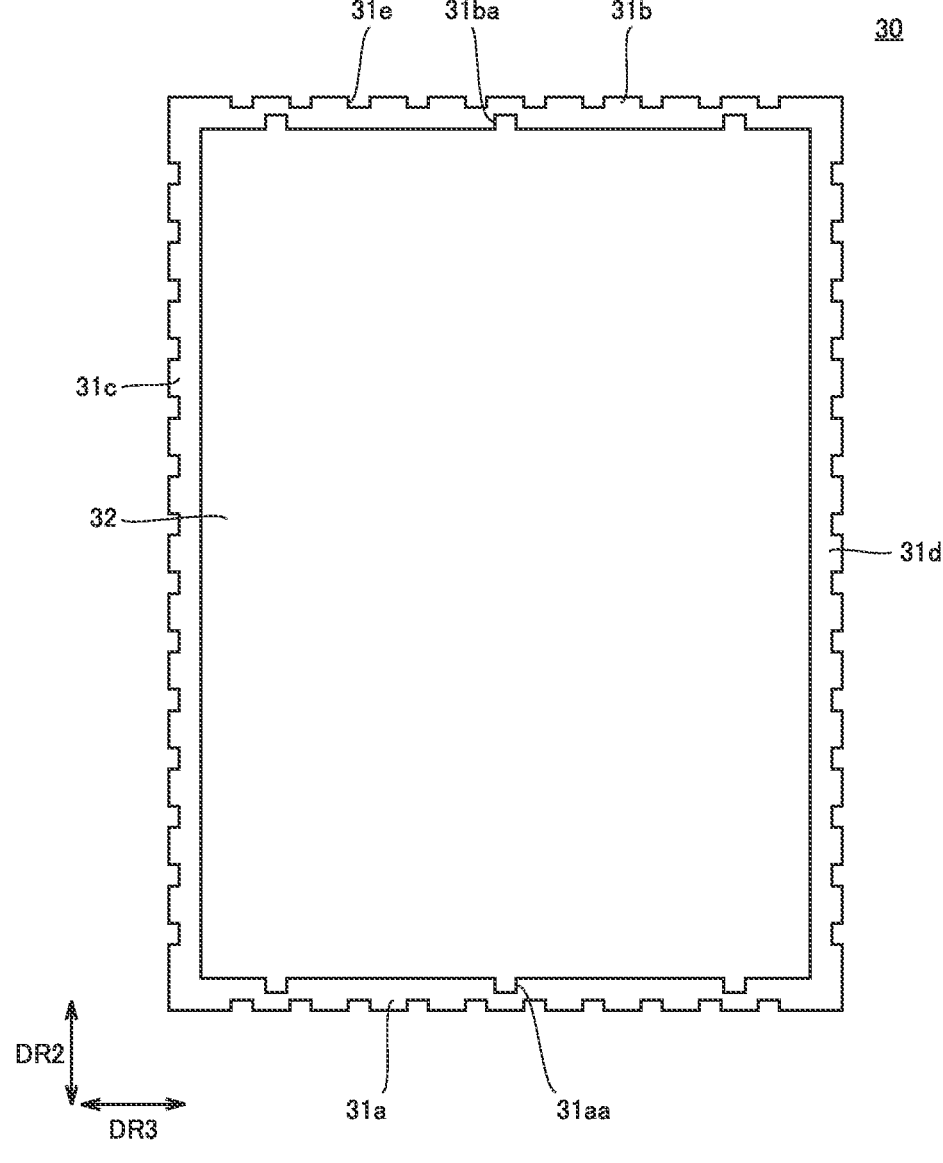
FIG. 10 is a plan view of case 30 included in Modification 1 of power conversion device 100.

FIG. 10 is a plan view of case 30 included in Modification 1 of power conversion device 100. As shown in FIG. 10, an outer wall surface of side wall 31 may be provided with a plurality of grooves 31*e*. Groove 31*e* extends in first direction DR1, for example. In this case, the outer wall surface of side wall 31 has an increased surface area, and thermal resistance between case 30 and outside air decreases, so that the temperature rise in capacitor 10*a* can be further suppressed.

<Modification 2 of Power Conversion Device 100>

Figure 11:
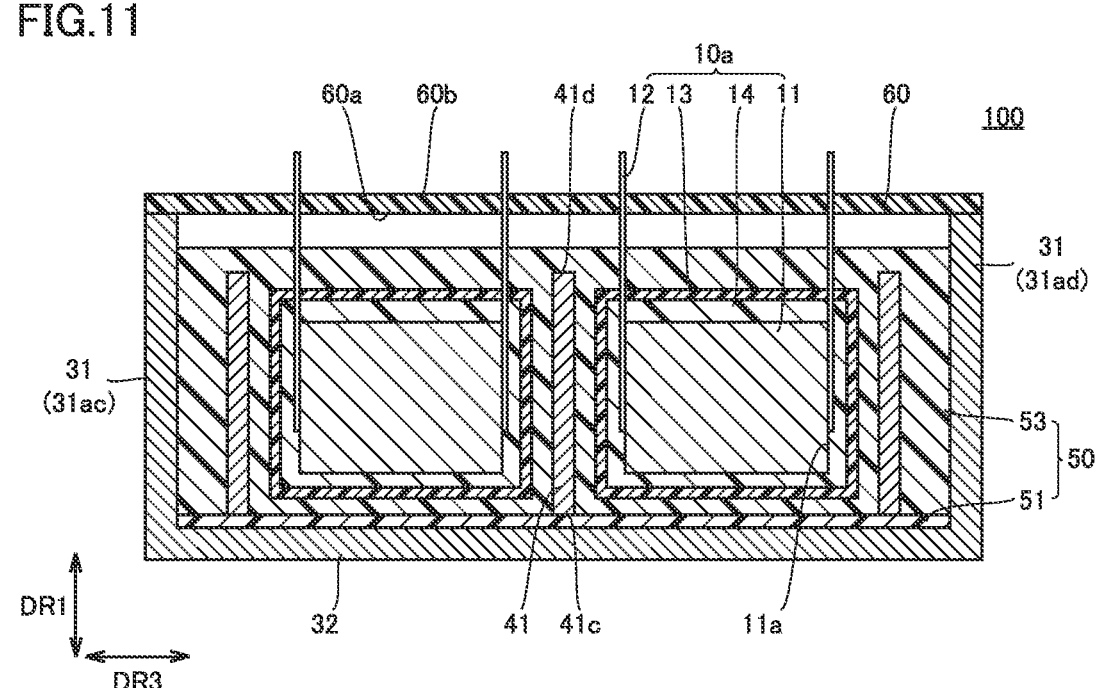
FIG. 11 is a cross-sectional view in Modification 2 of power conversion device 100.

FIG. 11 is a cross-sectional view in Modification 2 of power conversion device 100. FIG. 11 shows a cross section at a position corresponding to the line IV-IV in FIG. 2. As shown in FIG. 11, sealing material 50 may include a silicone gel 53 instead of molding material 52. Silicone gel 53 preferably has a low viscosity and high insulating properties.

Since silicone gel 53 adheres well to capacitor 10*a*, first heat dissipation plate 41 and second heat dissipation plate 42, there is no need to consider the creepage surface at a boundary with capacitor 10*a*, first heat dissipation plate 41 and second heat dissipation plate 42 when evaluating the insulating properties. In this case, therefore, an insulating area for ensuring the creepage distance is not required, which allows for downsizing around capacitor 10*a*. Additionally, in this case, the heat generated by capacitor 10*a* can be efficiently transferred to case 30. Further, silicone gel 53 is a material having a high rate of penetration, that is, a soft material. In this case, therefore, the reliability can be improved when a heat cycle or a power cycle is applied to power conversion device 100. Note that since the position fixation of capacitor 10*a* is also performed by the attachment of printed wiring board 60 to case 30, the position fixation of capacitor 10*a* is not affected by the high rate of penetration of silicone gel 53.

(Method for Assembling Power Conversion Device 100)

A method for assembling power conversion device 100 is described below.

In order to assemble power conversion device 100, firstly, case 30, the plurality of first heat dissipation plates 41, the plurality of second heat dissipation plates 42, and printed wiring board 60 with the plurality of capacitors 10*a* connected thereto are prepared. Secondly, heat dissipation auxiliary material 51 is applied onto the inner wall surface of bottom wall 32. At this time, heat dissipation auxiliary material 51 may also be applied onto first groove 31*aa* and second groove 31*ba*. Thirdly, first heat dissipation plate 41 is attached to case 30. The attachment of first heat dissipation plate 41 is performed by first end 41*a* and second end 41*b* being inserted into first groove 31*aa* and second groove 31*ba*, respectively.

Fourthly, second heat dissipation plate 42 is attached to first heat dissipation plate 41. The attachment of second heat dissipation plate 42 is performed by second insertion slot 42*c* being inserted into first insertion slot 41*e*. Fifthly, molding material 52 is injected into case 30. Sixthly, printed wiring board 60 is attached to the upper end of side wall 31. Thus, capacitor 10*a* is disposed in the space defined by two adjacent first heat dissipation plates 41, two adjacent second heat dissipation plates 42 and bottom wall 32, and is surrounded by molding material 52. Seventhly, molding material 52 is cured. The assembly of power conversion device 100 is thus completed.

<Modification 1 of Method for Assembling Power Conversion Device 100>

When heat dissipation auxiliary material 51 and molding material 52 are the same material, during the assembly of power conversion device 100, sealing material 50 may be injected into case 30 before the attachment of first heat dissipation plate 41 to case 30. In this case, the time required for the assembly can be reduced because fewer assembly steps are required.

<Modification 2 of Method for Assembling Power Conversion Device 100>

During the assembly of power conversion device 100, heat dissipation auxiliary material 51 may be applied after the attachment of first heat dissipation plate 41 to case 30 and the attachment of second heat dissipation plate 42 to first heat dissipation plate 41, and before the injection of molding material 52. In this case, first heat dissipation plate 41 will be in contact with bottom wall 32 without heat dissipation auxiliary material 51 interposed therebetween.

<Modification 3 of Method for Assembling Power Conversion Device 100>

When heat dissipation auxiliary material 51 and molding material 52 are the same material, during the assembly of power conversion device 100, sealing material 50 may be injected after the attachment of printed wiring board 60 to case 30. Sealing material 50 is injected through an injection port preformed in printed wiring board 60. In this case, the time required for the assembly can be reduced because fewer assembly steps are required.

(Advantageous Effects of Power Conversion Device 100)

Advantageous effects of power conversion device 100 are described below.

When an AC current flows through capacitor 10a during operation of power conversion device 100, power consumption occurs due to a resistance component of capacitor 10a, and capacitor 10a generates heat. The heat generation of capacitor 10a mainly occurs in capacitor element body 11, electrode surface 11a and lead wire 12.

In power conversion device 100, the plurality of capacitors 10a are densely arranged. Thus, when the heat generated by capacitors 10a interferes with each other and the temperature of capacitors 10a rises excessively, capacitors 10a may experience characteristic degradation, breakage, and decreased life.

In power conversion device 100, on the other hand, capacitor 10a is thermally connected to case 30 by sealing material 50, first heat dissipation plate 41 and second heat dissipation plate 42. According to power conversion device 100, therefore, the heat generated by capacitor 10a is dissipated to outside air from case 30, and the temperature rise in capacitor 10a is suppressed. The suppression of the temperature rise in capacitor 10a leads to increased life of capacitor 10a. For example, a temperature decrease of 10° C. in capacitor 10a leads to an approximately twofold increase in life of capacitor 10a.

Note that when circuit component 10 is inductor 10b, a temperature decrease of 10° C. in inductor 10b leads to an approximately twofold increase in life of an enamel coating of inductor 10b. When circuit component 10 is discharge resistor 10d or charge resistor 10e, ranks of electric power categories of discharge resistor 10d and charge resistor 10e can be lowered according to temperature derating, and the number of series or parallel discharge resistors 10d or charge resistors 10e can be reduced.

In power conversion device 100, the heat generated by capacitor 10a is transferred to first heat dissipation plate 41 through molding material 52. The heat transferred to first heat dissipation plate 41 is transferred from first end 41a and second end 41b to side wall 31, and is transferred from third end 41c to bottom wall 32 through heat dissipation auxiliary material 51. In power conversion device 100, therefore, a heat transfer path from capacitor 10a to case 30 has a large area, and thermal resistance from capacitor 10a to case 30 decreases, so that the temperature rise in capacitor 10a is suppressed.

A current concentrates on electrode surface 11a. Thus, it is important to cool electrode surface 11a in order to suppress the temperature rise in capacitor 10a. In power conversion device 100, since two electrode surfaces 11a of capacitor 10a face two different first heat dissipation plates 41, respectively, with molding material 52 interposed therebetween, the temperature rise in capacitor 10a can be further suppressed.

In power conversion device 100, first insertion slot 41e is formed in fourth end 41d. In other words, first insertion slot 41e is not formed in third end 41c. Thus, the heat transfer area between first heat dissipation plate 41 and bottom wall 32 increases, and thermal resistance between first heat dissipation plate 41 and bottom wall 32 decreases, so that the temperature rise in capacitor 10a can be further suppressed.

Power conversion device 100 includes, in addition to first heat dissipation plate 41, second heat dissipation plate 42 thermally connected to first heat dissipation plate 41. In power conversion device 100, therefore, the heat transferred from capacitor 10a to first heat dissipation plate 41 through molding material 52 is also transferred to case 30 through second heat dissipation plate 42, and the temperature rise in capacitor 10a is further suppressed.

In power conversion device 100, since first heat dissipation plate 41 extends in second direction DR2 and the plurality of capacitors 10a are arranged in second direction DR2, the temperature difference among the plurality of capacitors 10a arranged in second direction DR2 becomes small. Likewise, in power conversion device 100, since second heat dissipation plate 42 extends in third direction DR3 and the plurality of capacitors 10a are arranged in third direction DR3, the temperature difference among the plurality of capacitors 10a arranged in second direction DR2 becomes small.

The temperature rise in capacitor 10a depends on the position at which it is disposed. More specifically, capacitor 10a disposed near the center of power conversion device 100 is affected by the heat generated by capacitor 10a disposed around it, and is thus more likely to rise in temperature than capacitor 10a disposed near the outer periphery of power conversion device 100. The temperature derating is determined by capacitor 10a having the highest temperature. As described above, in power conversion device 100, the temperature is equalized among the plurality of capacitors 10a by first heat dissipation plate 41 and second heat dissipation plate 42, which can allow for more effective use of power conversion device 100. Additionally, in power conversion device 100, as a result of the equalization of temperature among the plurality of capacitors 10a, the number of series or parallel capacitors 10a can be reduced.

In power conversion device 100, either first heat dissipation plate 41 or second heat dissipation plate 42 is disposed between two adjacent capacitors 10a. Thus, first heat dissipation plate 41 and second heat dissipation plate 42 function as fire walls. In other words, even if a spark and an impact of discharge occur due to a failure of one capacitor 10a, the spark and the impact are prevented from reaching other capacitors 10a by first heat dissipation plate 41 and second heat dissipation plate 42. When circuit component 10 is inductor 10b, a leakage flux from inductor 10b to the surroundings is shielded by first heat dissipation plate 41 and second heat dissipation plate 42, which can lead to improved accuracy of a sensor component (such as a current sensor using the Hall effect) disposed in the surroundings.

In power conversion device 100, since sealing material 50 fills case 30, capacitor 10a has improved vibration resistance. When the inner wall surface of side wall 31, the side surface of first heat dissipation plate 41 and the side surface of second heat dissipation plate 42 each have an arithmetic average roughness of 6.3 μm or more, the adhesion between these surfaces and sealing material 50 is improved, which leads to improved mechanical strength of power conversion device 100.

In power conversion device 100, by increasing or decreasing the number of first heat dissipation plates 41 and the number of the second heat dissipation plates, the number or size of partitions arranged in a number sign pattern by two adjacent first heat dissipation plates 41 and two adjacent second heat dissipation plates 42 can be increased or decreased depending on the number or size of capacitors 10a. Additionally, in power conversion device 100, the thickness, type, material, etc. of each of first heat dissipation plate 41 and second heat dissipation plate 42 can be selected as desired. Further, in power conversion device 100, by bending or concave-convex pressing first heat dissipation plate 41 and second heat dissipation plate 42, the strength of first heat dissipation plate 41 and second heat dissipation plate 42 can be ensured, and the shape of partitions in the number sign pattern can be changed. In this manner, various specifications can be implemented flexibly and at low cost in power conversion device 100.

The temperature of capacitor 10a tends to rise at electrode surface 11a where a current concentrates. In power conversion device 100, since electrode surface 11a faces first heat dissipation plate 41 (or second heat dissipation plate 42), the heat generated in electrode surface 11a is readily transferred to case 30 through first heat dissipation plate 41 (or second heat dissipation plate 42), and the temperature rise in capacitor 10a can be further suppressed.

When seventh end 42e is located away from the inner wall surface of third side wall portion 31c, and eighth end 42f is located away from the inner wall surface of fourth side wall portion 31d, molding material 52 readily fills the space between seventh end 42e and third side wall portion 31c and the space between eighth end 42f and fourth side wall portion 31d. This leads to improved manufacturing efficiency of power conversion device 100, and allows the heat generated in capacitor 10a to be readily transferred to case 30 through molding material 52.

Since second heat dissipation plate 42 is positioned by intersecting first heat dissipation plate 41, when seventh end 42e and eighth end 42f contact the inner wall surface of third side wall portion 31c and the inner wall surface of fourth side wall portion 31d, respectively, second heat dissipation plate 42 may flex and break unless a dimensional tolerance of first insertion slot 41e and second insertion slot 42c is strictly controlled. When seventh end 42e is located away from the inner wall surface of third side wall portion 31c and eighth end 42f is located away from the inner wall surface of fourth side wall portion 31d, on the other hand, such damage to second heat dissipation plate 42 can be suppressed even if the dimensional tolerance of first insertion slot 41e and second insertion slot 42c is loosely controlled.

Embodiment 2

A power conversion device according to Embodiment 2 is described. The power conversion device according to Embodiment 2 is referred to as a power conversion device 100A. In the following description, the differences from power conversion device 100 will be mainly described, and the same description will not be repeated.

(Configuration of Power Conversion Device 100A)

The configuration of power conversion device 100A is described below.

Power conversion device 100A includes the plurality of circuit components 10, case 30, the plurality of first heat dissipation plates 41, the plurality of second heat dissipation plates 42, sealing material 50, and printed wiring board 60. In this respect, the configuration of power conversion device 100A is the same as that of power conversion device 100.

Figure 12:
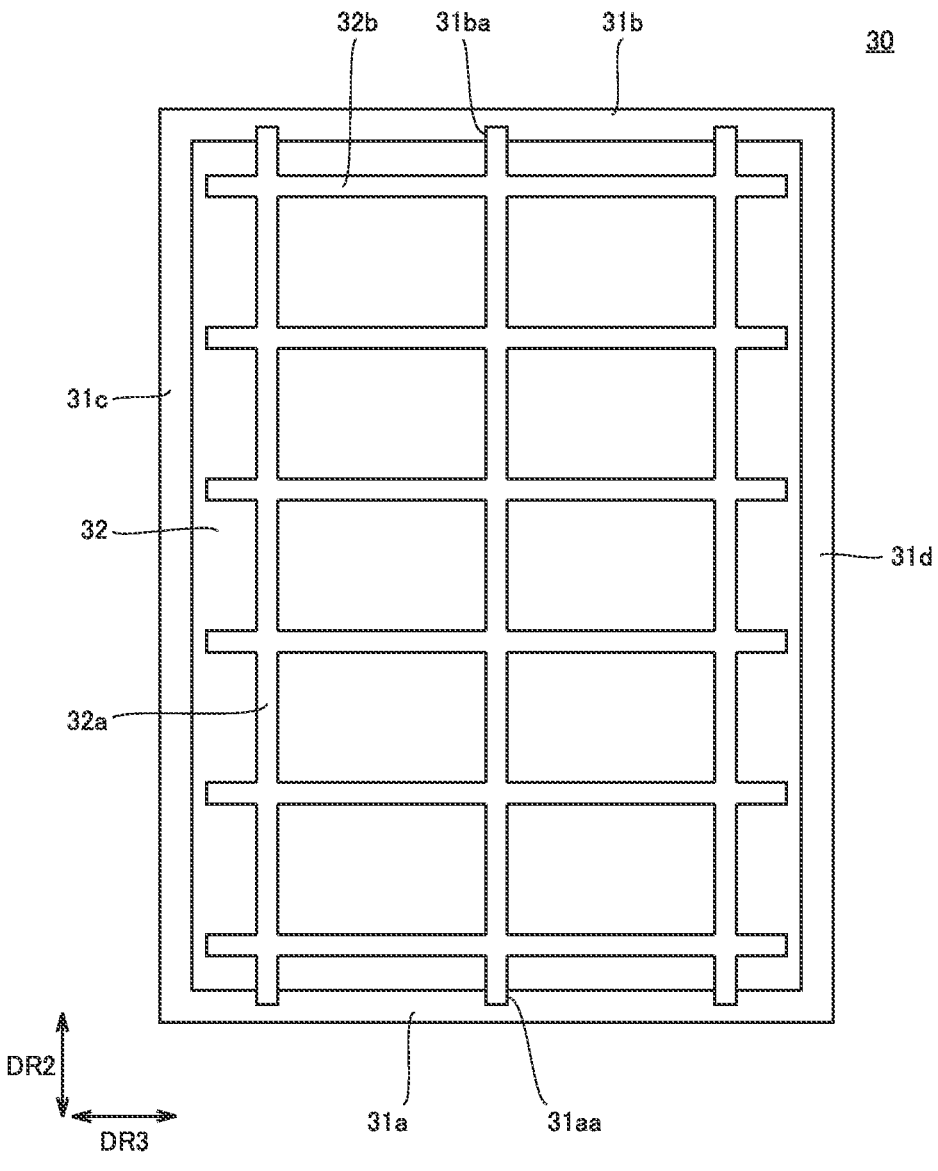
FIG. 12 is a plan view of case 30 included in a power conversion device 100A.
Figure 13:
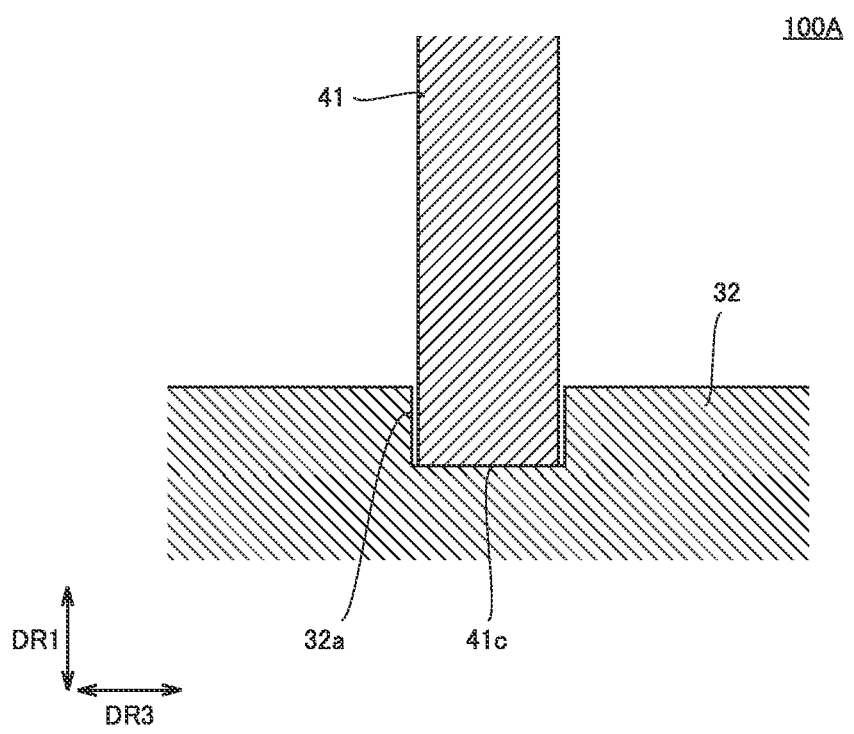
Figure 14:
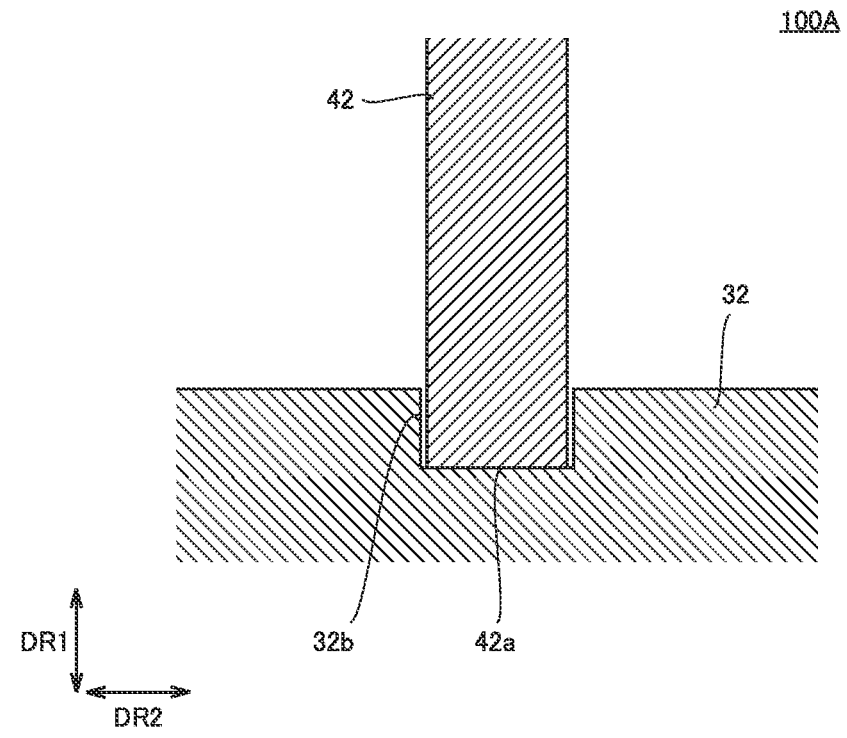
FIG. 14 is an enlarged cross-sectional view of power conversion device 100A in the vicinity of a fourth groove 32b.

FIG. 12 is a plan view of case 30 included in power conversion device 100A. FIG. 13 is an enlarged cross-sectional view of power conversion device 100A in the vicinity of a third groove 32a. FIG. 13 shows an enlarged cross section orthogonal to second direction DR2. FIG. 14 is an enlarged cross-sectional view of power conversion device 100A in the vicinity of a fourth groove 32b. FIG. 14 shows an enlarged cross section orthogonal to third direction DR3. As shown in FIGS. 12 to 14, in power conversion device 100A, the inner wall surface of bottom wall 32 is provided with a plurality of third grooves 32a and a plurality of fourth grooves 32b.

Third groove 32a extends in second direction DR2. The plurality of third grooves 32a are spaced from one another in third direction DR3. The third end 41c side of first heat dissipation plate 41 is inserted into third groove 32a. Fourth groove 32b extends in third direction DR3. The plurality of fourth grooves 32b are spaced from one another in second direction DR2. The fifth end 42a side of second heat dissipation plate 42 is inserted into fourth groove 32b. Although not shown, sealing material 50 may or may not fill third groove 32a and fourth groove 32b. In these respects, the configuration of power conversion device 100A is different from that of power conversion device 100.

(Advantageous Effects of Power Conversion Device 100A)

Advantageous effects of power conversion device 100A are described below.

In power conversion device 100A, since first heat dissipation plate 41 is inserted into third groove 32a and second heat dissipation plate 42 is inserted into fourth groove 32b, the heat transfer area between bottom wall 32 and each of first heat dissipation plate 41 and second heat dissipation plate 42 increases, and thermal resistance between bottom wall 32 and each of first heat dissipation plate 41 and second heat dissipation plate 42 decreases. As a result, according to power conversion device 100A, the temperature rise in capacitor 10a can be further suppressed.

Additionally, in power conversion device 100A, since first heat dissipation plate 41 is inserted into third groove 32a and second heat dissipation plate 42 is inserted into fourth groove 32b, the assemblability and positioning accuracy of first heat dissipation plate 41 and second heat dissipation plate 42 are improved. As a result of the improved positioning accuracy of first heat dissipation plate 41 and second heat dissipation plate 42, the distance between capacitor 10a and each of first heat dissipation plate 41 and second heat dissipation plate 42 can be accurately set, and the thickness of sealing material 50 can be decreased to reduce thermal resistance between capacitor 10a and each of first heat dissipation plate 41 and second heat dissipation plate 42.

Further, in power conversion device 100A, since first heat dissipation plate 41 and second heat dissipation plate 42 are fixed to bottom wall 32, sealing material 50 can more reliably fill the space defined by two adjacent first heat dissipation plates 41, two adjacent second heat dissipation plates 42 and bottom wall 32.

Third Embodiment

A power conversion device according to Embodiment 3 is described. The power conversion device according to Embodiment 3 is referred to as a power conversion device 100B. In the following description, the differences from power conversion device 100A will be mainly described, and the same description will not be repeated.

Power conversion device 100B includes the plurality of circuit components 10, case 30, the plurality of first heat dissipation plates 41, the plurality of second heat dissipation plates 42, sealing material 50, and printed wiring board 60. In this respect, the configuration of power conversion device 100B is the same as that of power conversion device 100A.

Figure 15:
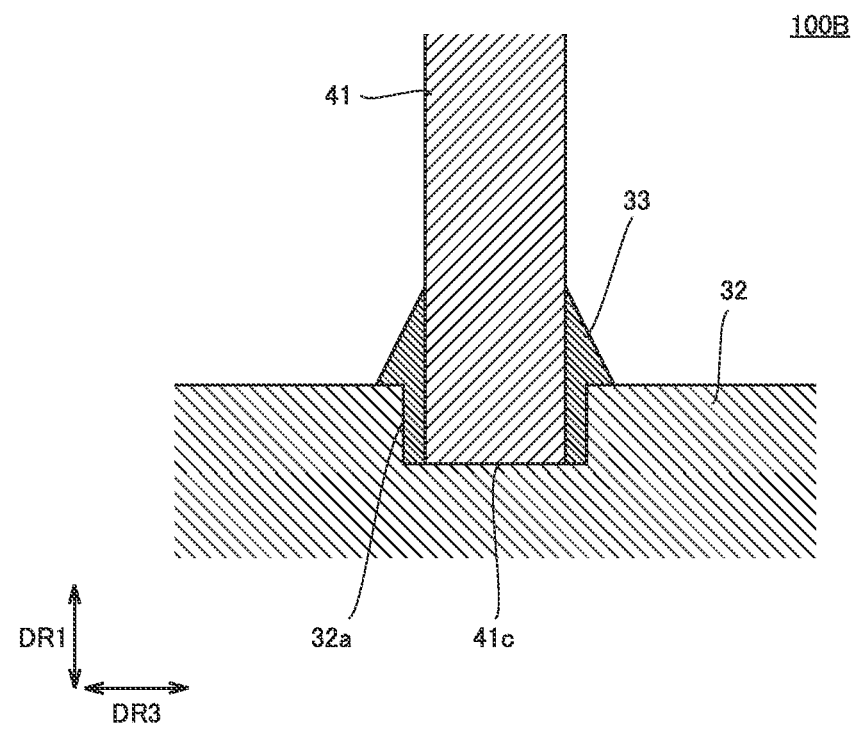
Figure 16:
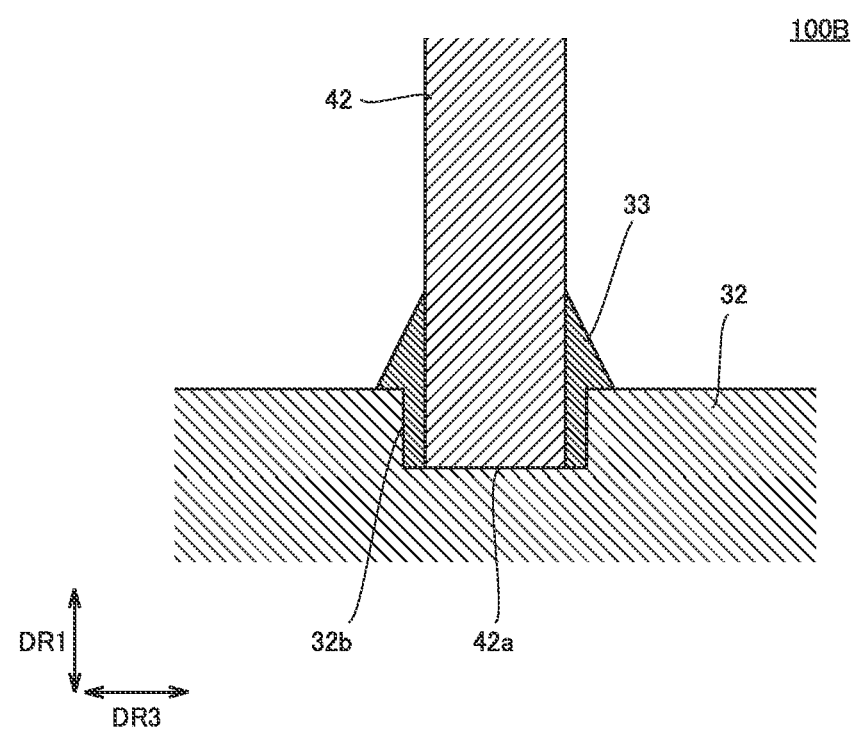
FIG. 16 is an enlarged cross-sectional view of power conversion device 100B in the vicinity of fourth groove 32b.

FIG. 15 is an enlarged cross-sectional view of power conversion device 100B in the vicinity of third groove 32a. FIG. 15 shows an enlarged cross section orthogonal to second direction DR2. FIG. 16 is an enlarged cross-sectional view of power conversion device 100B in the vicinity of fourth groove 32b. FIG. 16 shows an enlarged cross section orthogonal to third direction DR3. As shown in FIGS. 15 and 16, in power conversion device 100B, first heat dissipation plate 41 is metal bonded on the third end 41c side to third groove 32a. In power conversion device 100B, second heat dissipation plate 42 is metal bonded on the fifth end 42a side to fourth groove 32b.

Note that first heat dissipation plate 41 may not be metal bonded to third groove 32a in the entire portion that is inserted into third groove 32a, and second heat dissipation plate 42 may not be metal bonded to fourth groove 32b in the entire portion that is inserted into fourth groove 32b. The metal bonding between first heat dissipation plate 41 and third groove 32a and the metal bonding between second heat dissipation plate 42 and fourth groove 32b is performed, for example, with a brazing material 33. The metal bonding between first heat dissipation plate 41 and third groove 32a and the metal bonding between second heat dissipation plate 42 and fourth groove 32b may be performed by welding. In these respects, the configuration of power conversion device 100B is different from that of power conversion device 100A.

(Advantageous Effects of Power Conversion Device 100B)

Advantageous effects of power conversion device 100B are described below.

In power conversion device 100B, since first heat dissipation plate 41 is metal bonded to third groove 32a and second heat dissipation plate 42 is metal bonded to fourth groove 32b, thermal resistance between bottom wall 32 and each of first heat dissipation plate 41 and second heat dissipation plate 42 decreases. As a result, according to power conversion device 100B, the temperature rise in capacitor 10a can be further suppressed.

Additionally, in power conversion device 100B, since first heat dissipation plate 41 is metal bonded to third groove 32a and second heat dissipation plate 42 is metal bonded to fourth groove 32b, the assemblability and positioning accuracy of first heat dissipation plate 41 and second heat dissipation plate 42 are improved. As a result of the improved positioning accuracy of first heat dissipation plate 41 and second heat dissipation plate 42, the distance between capacitor 10a and each of first heat dissipation plate 41 and second heat dissipation plate 42 can be accurately set, and the thickness of sealing material 50 can be decreased to reduce thermal resistance between capacitor 10a and each of first heat dissipation plate 41 and second heat dissipation plate 42.

Further, in power conversion device 100B, since first heat dissipation plate 41 and second heat dissipation plate 42 are fixed to bottom wall 32, sealing material 50 can more reliably fill the space defined by two adjacent first heat dissipation plates 41, two adjacent second heat dissipation plates 42 and bottom wall 32.

(Modification 1 of Power Conversion Device 100B)

Figure 17:
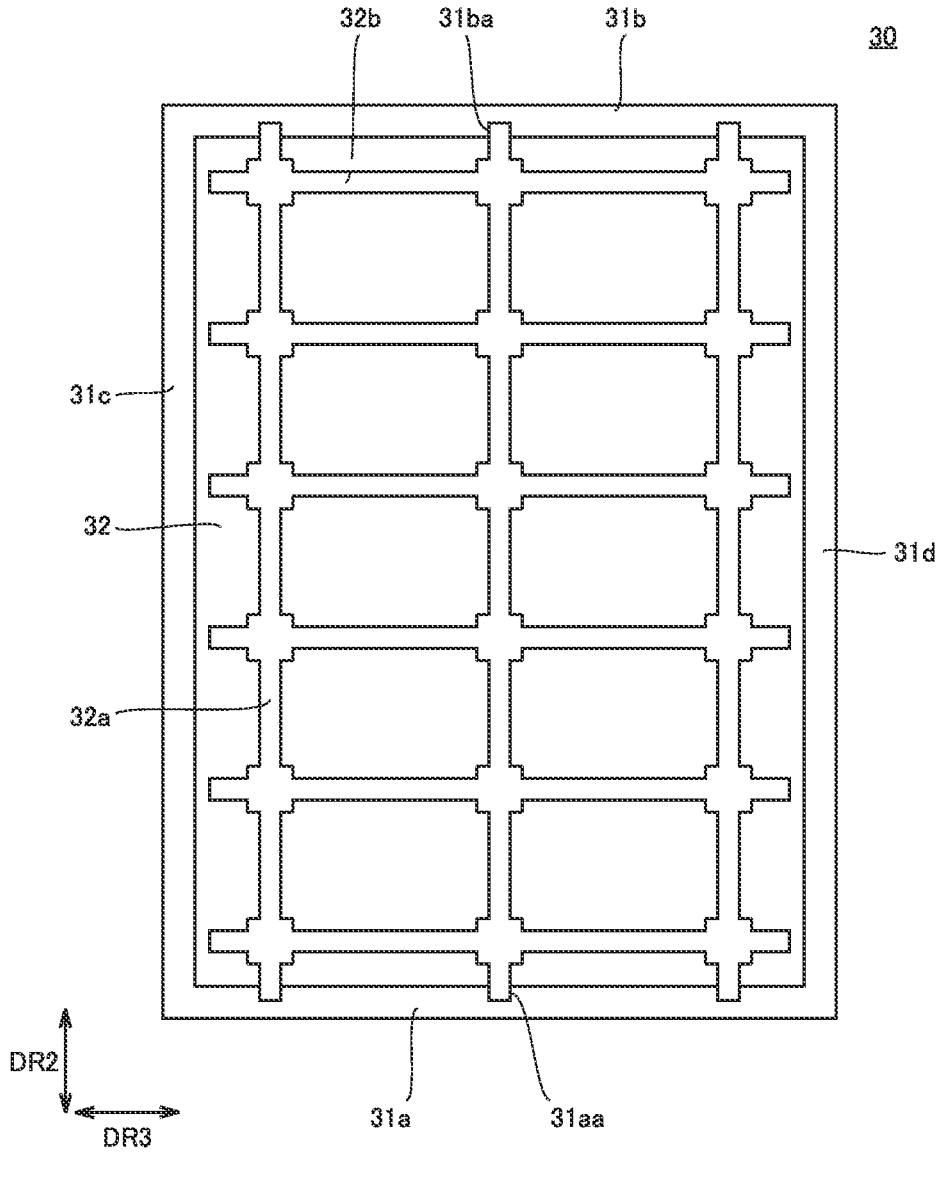
FIG. 17 is a plan view of case 30 included in Modification 1 of power conversion device 100B.

FIG. 17 is a plan view of case 30 included in Modification 1 of power conversion device 100B. As shown in FIG. 17, in power conversion device 100B, third groove 32a may be widened at the intersection with fourth groove 32b, and fourth groove 32b may be widened at the intersection with third groove 32a. Although not shown, in power conversion device 100B, third groove 32a may be widened at its end portion in second direction DR2, and fourth groove 32b may be widened at its end portion in third direction DR3. In this case, the widened portions of third groove 32a and fourth groove 32b can be prevented from serving as brazing material pools, which cause an overflow of brazing material 33 from third groove 32a and fourth groove 32b to result in bonding failure.

(Modification 2 of Power Conversion Device 100B)

Figure 18:
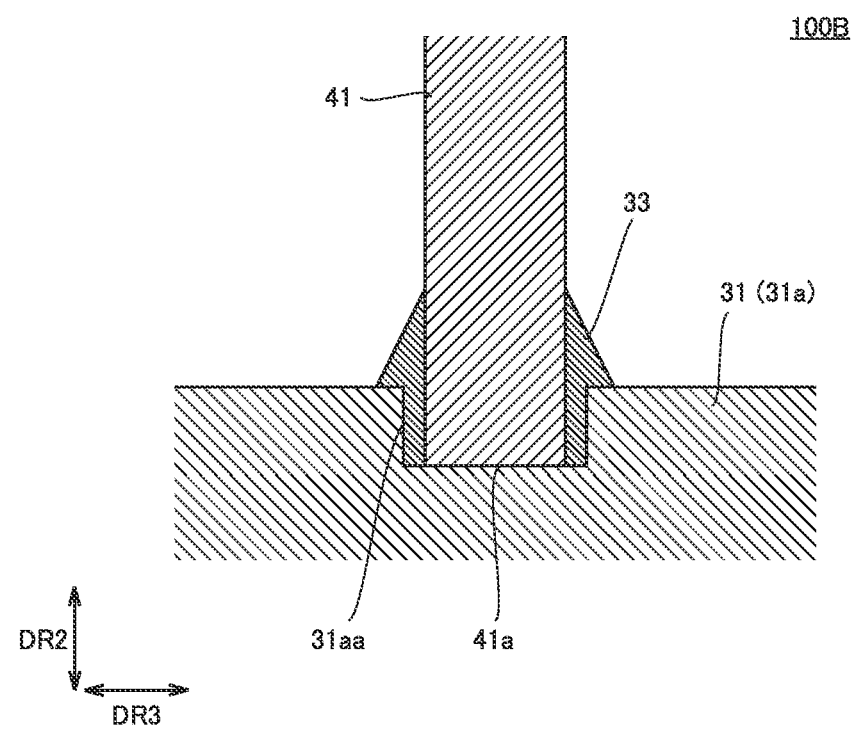
FIG. 18 is an enlarged cross-sectional view of Modification 2 of power conversion device 100B in the vicinity of a first groove 31aa.
Figure 19:
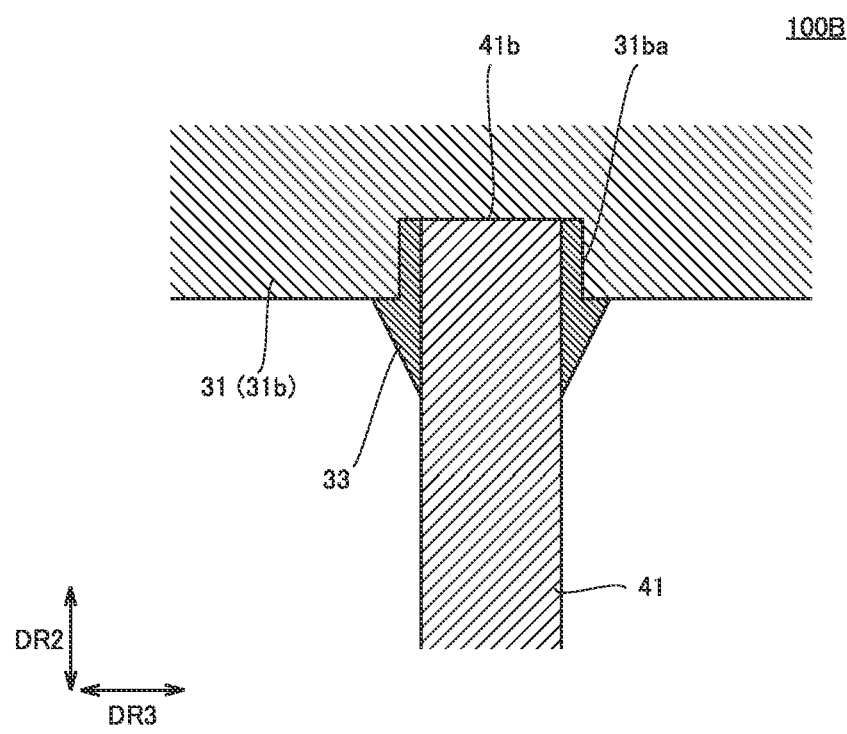
FIG. 19 is an enlarged cross-sectional view of Modification 2 of power conversion device 100B in the vicinity of a second groove 31ba.

FIG. 18 is an enlarged cross-sectional view of Modification 2 of power conversion device 100B in the vicinity of first groove 31aa. FIG. 19 is an enlarged cross-sectional view of Modification 2 of power conversion device 100B in the vicinity of second groove 31ba. FIGS. 18 and 19 show enlarged cross sections orthogonal to first direction DR1. As shown in FIGS. 18 and 19, in power conversion device 100B, first heat dissipation plate 41 may be metal bonded on the first end 41a side to first groove 31aa, and may be metal bonded on the second end 41b side to second groove 31ba.

The metal bonding between first heat dissipation plate 41 and each of first groove 31aa and second groove 31ba is performed, for example, with brazing material 33. The metal bonding between first heat dissipation plate 41 and each of first groove 31aa and second groove 31ba may be performed by welding. In this case, thermal resistance between first heat dissipation plate 41 and side wall 31 decreases, so that the temperature rise in capacitor 10a can be further suppressed.

Embodiment 4

A power conversion device according to Embodiment 4 is described. The power conversion device according to Embodiment 4 is referred to as a power conversion device 100C. In the following description, the differences from power conversion device 100A will be mainly described, and the same description will not be repeated.

Power conversion device 100C includes the plurality of circuit components 10, case 30, the plurality of first heat dissipation plates 41, the plurality of second heat dissipation plates 42, sealing material 50, and printed wiring board 60. In this respect, the configuration of power conversion device 100C is the same as that of power conversion device 100A.

Figure 20:
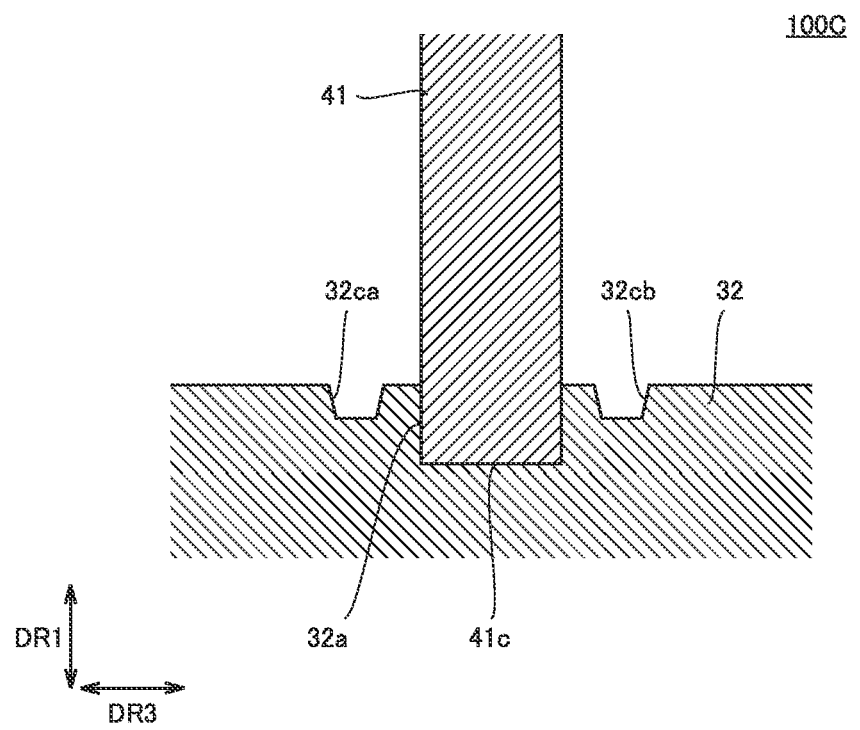
Figure 21:
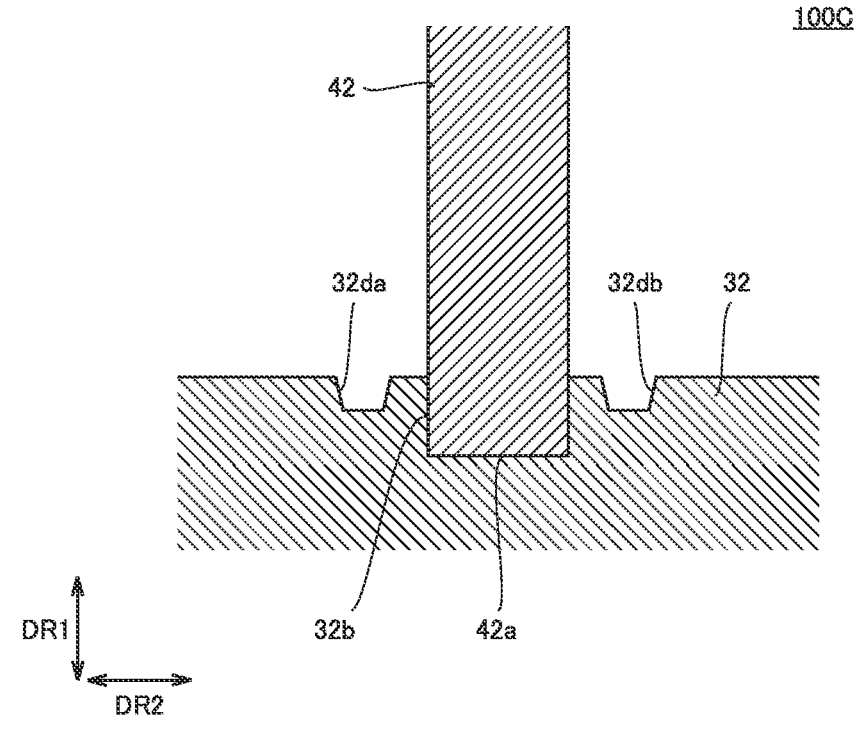
FIG. 21 is an enlarged cross-sectional view of power conversion device 100C in the vicinity of fourth groove 32b.

FIG. 20 is an enlarged cross-sectional view of power conversion device 100C in the vicinity of third groove 32a. FIG. 20 shows an enlarged cross section orthogonal to second direction DR2. FIG. 21 is an enlarged cross-sectional view of power conversion device 100C in the vicinity of fourth groove 32b. FIG. 21 shows an enlarged cross section orthogonal to third direction DR3. As shown in FIGS. 20 and 21, in power conversion device 100C, first heat dissipation plate 41 is metal bonded on the third end 41c side to third groove 32a by caulking. In power conversion device 100C, second heat dissipation plate 42 is metal bonded on the fifth end 42a side to fourth groove 32b by caulking.

More specifically, in power conversion device 100C, the inner wall surface of bottom wall 32 is provided with a caulking groove 32ca and a caulking groove 32cb. Caulking groove 32ca and caulking groove 32cb extend in second direction DR2. Third groove 32a is disposed between caulking groove 32ca and caulking groove 32cb in third direction DR3. Additionally, in power conversion device 100C, the inner wall surface of bottom wall 32 is provided with a caulking groove 32da and a caulking groove 32db. Caulking groove 32da and caulking groove 32db extend in third direction DR3. Fourth groove 32b is disposed between caulking groove 32da and caulking groove 32db in second direction DR2.

When first heat dissipation plate 41 is caulked into third groove 32a, a press tool is inserted into caulking groove 32ca and caulking groove 32cb. Thus, the portion of bottom wall 32 between caulking groove 32ca and third groove 32a and the portion of bottom wall 32 between caulking groove 32cb and third groove 32a are plastically deformed toward first heat dissipation plate 41, and first heat dissipation plate 41 is caulked into third groove 32a. Likewise, second heat dissipation plate 42 is caulked into fourth groove 32b by insertion of a press tool into caulking groove 32da and caulking groove 32db. Note that first heat dissipation plate 41 may not be caulked into third groove 32a in the entire portion that is inserted into third groove 32a, and second heat dissipation plate 42 may not be caulked into fourth groove 32b in the entire portion that is inserted into fourth groove 32b. In these respects, the configuration of power conversion device 100C is different from that of power conversion device 100A.

(Advantageous Effects of Power Conversion Device 100C)

Advantageous effects of power conversion device 100C are described below.

In power conversion device 100C, since first heat dissipation plate 41 is metal bonded to third groove 32a and second heat dissipation plate 42 is metal bonded to fourth groove 32b by caulking, thermal resistance between bottom wall 32 and each of first heat dissipation plate 41 and second heat dissipation plate 42 decreases. As a result, according to power conversion device 100C, the temperature rise in capacitor 10a can be further suppressed.

Additionally, in power conversion device 100C, since first heat dissipation plate 41 is metal bonded to third groove 32a and second heat dissipation plate 42 is metal bonded to fourth groove 32b by caulking, the assemblability and positioning accuracy of first heat dissipation plate 41 and second heat dissipation plate 42 are improved. As a result of the improved positioning accuracy of first heat dissipation plate 41 and second heat dissipation plate 42, the distance between capacitor 10a and each of first heat dissipation plate 41 and second heat dissipation plate 42 can be accurately set, and the thickness of sealing material 50 can be decreased to reduce thermal resistance between capacitor 10a and each of first heat dissipation plate 41 and second heat dissipation plate 42.

Further, in power conversion device 100C, since first heat dissipation plate 41 and second heat dissipation plate 42 are fixed to bottom wall 32, sealing material 50 can more reliably fill the space defined by two adjacent first heat dissipation plates 41, two adjacent second heat dissipation plates 42 and bottom wall 32.

(Modification 1 of Power Conversion Device 100C)

Figure 22:
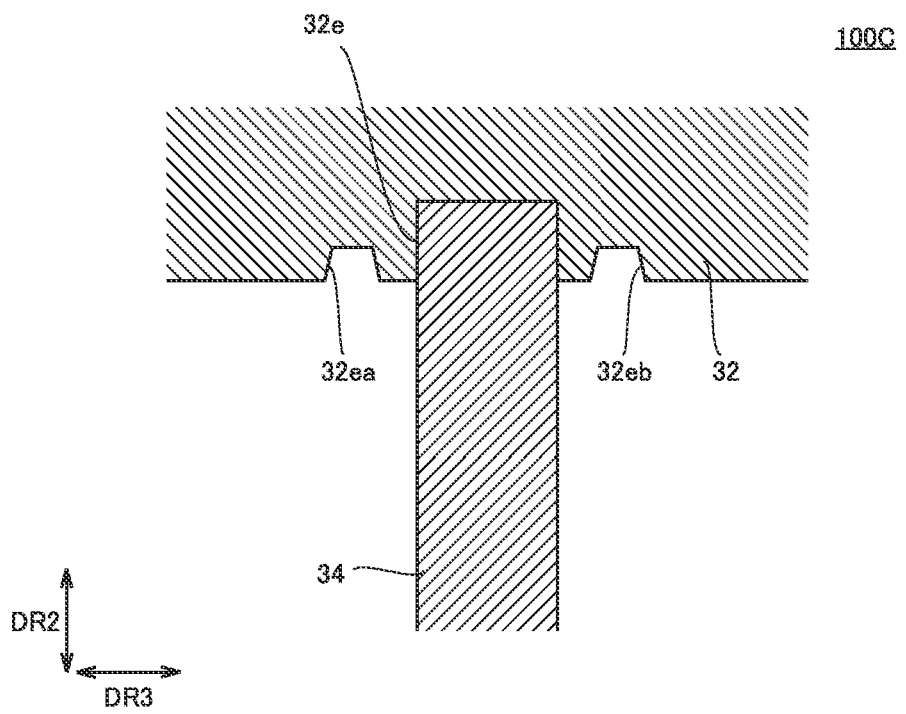
FIG. 22 is an enlarged cross-sectional view of power conversion device 100C in the vicinity of a bottom wall 32.

FIG. 22 is an enlarged cross-sectional view of power conversion device 100C in the vicinity of bottom wall 32. FIG. 22 shows an enlarged cross section orthogonal to second direction DR2. As shown in FIG. 22, in power conversion device 100C, an outer wall surface of bottom wall 32 may be provided with a plurality of fifth grooves 32e. Fifth groove 32e extends in second direction DR2. The plurality of fifth grooves 32e are spaced from one another in third direction DR3. Note that fifth groove 32e may extend in third direction DR3. In this case, the plurality of fifth grooves 32e are spaced from one another in second direction DR2.

In power conversion device 100C, the outer wall surface of bottom wall 32 may be further provided with a caulking groove 32ea and a caulking groove 32eb. Caulking groove 32ea and caulking groove 32eb extend in second direction DR2. Fifth groove 32e is disposed between caulking groove 32ea and caulking groove 32eb. Note that when fifth groove 32e extends in third direction DR3, caulking groove 32ea and caulking groove 32eb extend in third direction DR3.

Power conversion device 100C may include a plurality of plate members 34. Plate member 34 is inserted into fifth groove 32e and caulked into fifth groove 32e. The caulking of plate member 34 into fifth groove 32e is performed by insertion of a press tool into caulking groove 32ea and caulking groove 32eb. Since plate member 34 caulked into fifth groove 32e functions as a cooling fin, heat dissipation performance from case 30 to outside air is improved, and the temperature rise in capacitor 10a can be further suppressed.

(Modification 2 of Power Conversion Device 100C)

Figure 23:
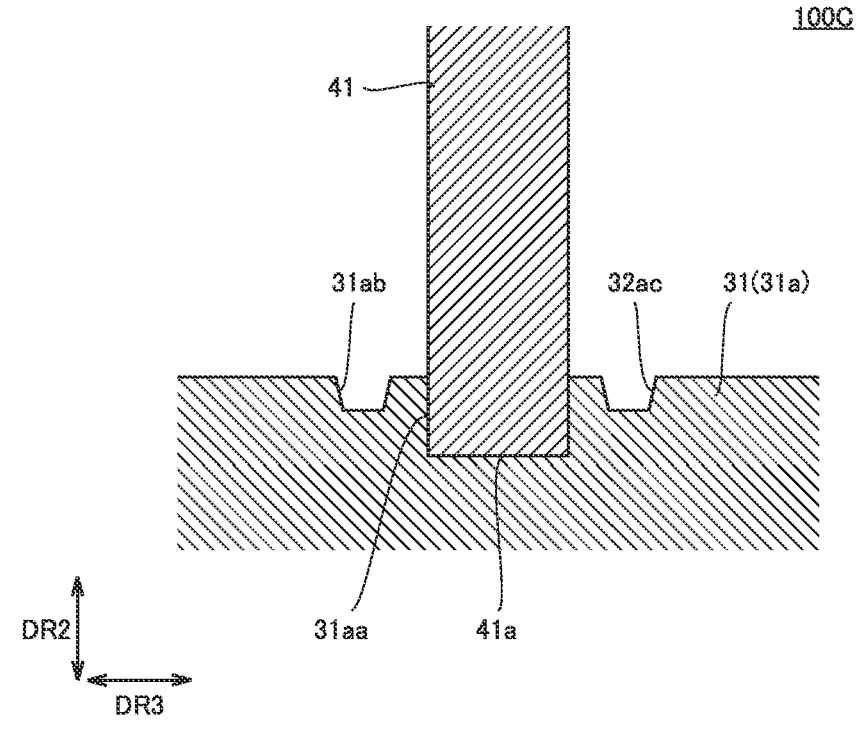
FIG. 23 is an enlarged cross-sectional view of Modification 2 of power conversion device 100C in the vicinity of first groove 31aa.
Figure 24:
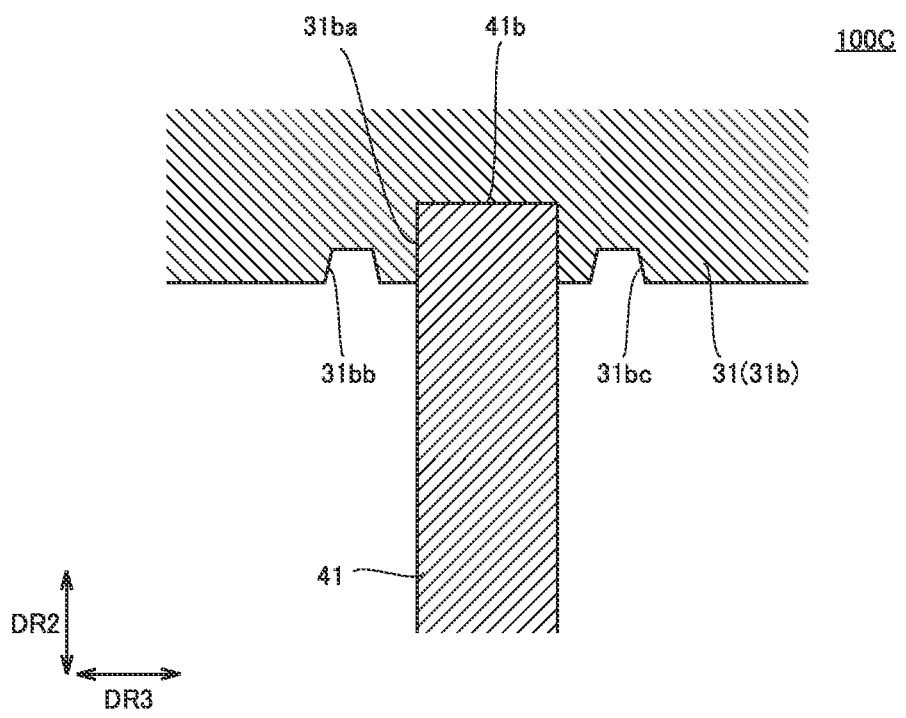
FIG. 24 is an enlarged cross-sectional view of Modification 2 of power conversion device 100C in the vicinity of second groove 31ba.

FIG. 23 is an enlarged cross-sectional view of Modification 2 of power conversion device 100C in the vicinity of first groove 31aa. FIG. 24 is an enlarged cross-sectional view of Modification 2 of power conversion device 100C in the vicinity of second groove 31ba. FIGS. 23 and 24 show enlarged cross sections orthogonal to first direction DR1. As shown in FIGS. 23 and 24, in power conversion device 100C, first heat dissipation plate 41 may be metal bonded on the first end 41a side to first groove 31aa, and may be metal bonded on the second end 41b side to second groove 31ba, by caulking.

In power conversion device 100C, the inner wall surface of first side wall portion 31a may be provided with a caulking groove 31ab and a caulking groove 31ac. In power conversion device 100C, the inner wall surface of second side wall portion 31b may be provided with a caulking groove 31bb and a caulking groove 31bc. Caulking groove 31ab, caulking groove 31ac, caulking groove 31bb and caulking groove 31bc extend in first direction DR1. First groove 31aa is disposed between caulking groove 31ab and caulking groove 31ac, and second groove 31ba is disposed between caulking groove 31bb and caulking groove 31bc.

First heat dissipation plate 41 is caulked into first groove 31aa by insertion of a press tool into caulking groove 31ab and caulking groove 31ac, and is caulked into second groove 31ba by insertion of a press tool into caulking groove 31bb and caulking groove 31bc. In this case, thermal resistance between first heat dissipation plate 41 and side wall 31 decreases, so that the temperature rise in capacitor 10a can be further suppressed.

Embodiment 5

A power conversion device according to Embodiment 5 is described. The power conversion device according to Embodiment 5 is referred to as a power conversion device 100D. In the following description, the differences from power conversion device 100 will be mainly described, and the same description will not be repeated.

(Configuration of Power Conversion Device 100D)

The configuration of power conversion device 100D is described below.

Power conversion device 100D includes the plurality of circuit components 10, case 30, the plurality of first heat dissipation plates 41, the plurality of second heat dissipation plates 42, sealing material 50, and printed wiring board 60. In this respect, the configuration of power conversion device 100D is the same as that of power conversion device 100.

Figure 25:
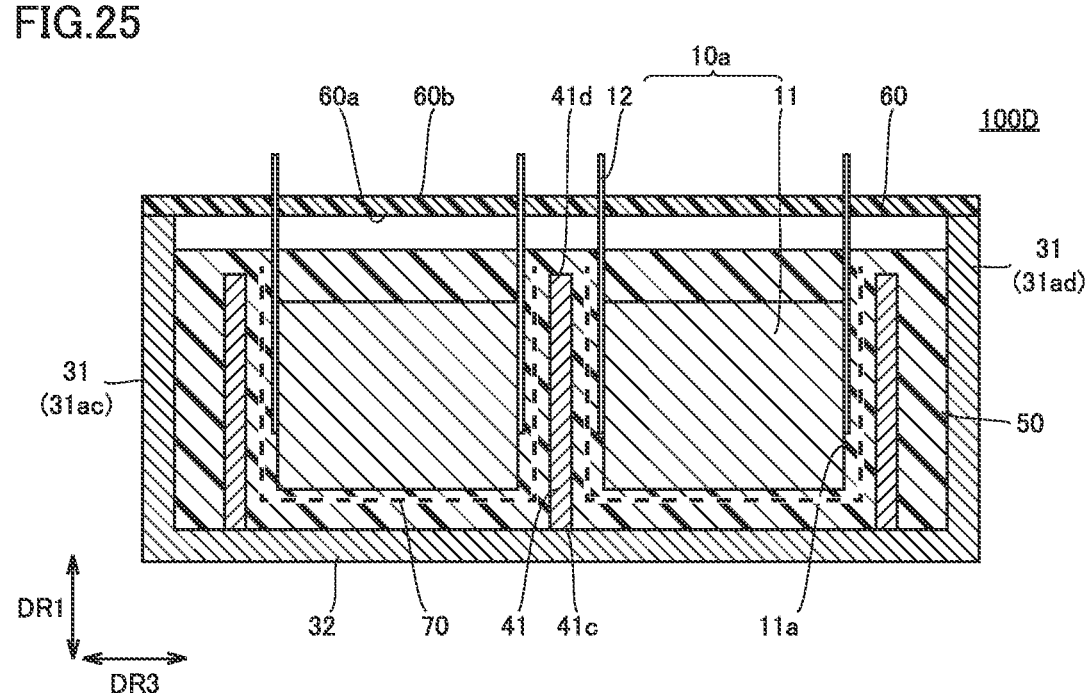
FIG. 25 is a cross-sectional view of a power conversion device 100D.

FIG. 25 is a cross-sectional view of power conversion device 100D. FIG. 25 shows a cross section at a position corresponding to the line IV-IV in FIG. 2. As shown in FIG. 25, in power conversion device 100D, capacitor 10a does not include exterior case 13 and sealing resin 14. Power conversion device 100D further includes an insulating net 70. Insulating net 70 is a net-like member made of an insulating resin material. Insulating net 70 is made of, for example, epoxy resin, silicone resin, urethane resin, etc. Insulating net 70 may be made of a flexible and stretchable rubber material.

Insulating net 70 is disposed in the space defined by two adjacent first heat dissipation plates 41, two adjacent second heat dissipation plates 42 and bottom wall 32, so as to surround capacitor 10a. In other words, insulating net 70 is located between capacitor 10a and each of first heat dissipation plate 41, second heat dissipation plate 42 and bottom wall 32. While insulating net 70 and capacitor 10a are not in contact with each other in the example shown in FIG. 25, insulating net 70 may be in contact with capacitor 10a. It is only necessary that capacitor 10a be not in contact with first heat dissipation plate 41, second heat dissipation plate 42 and bottom wall 32 by insulating net 70.

In power conversion device 100D, sealing material 50 may not include heat dissipation auxiliary material 51 and molding material 52. In power conversion device 100D, sealing material 50 may be formed by potting of any resin material. In these respects, the configuration of power conversion device 100D is different from that of power conversion device 100.

(Advantageous Effects of Power Conversion Device 100D)

Advantageous effects of power conversion device 100D are described below.

In power conversion device 100D, since capacitor 10a does not include exterior case 13 and sealing resin 14, the number of turns of the metal film and the dielectric film in capacitor 10a can be increased, allowing for an increase in capacitance per capacitor 10a. Additionally, in power conversion device 100D, since capacitor 10a does not include exterior case 13 and sealing resin 14, the cost of capacitor 10a can be reduced.

Note that in power conversion device 100D, since insulating net 70 is disposed between capacitor 10a and each of first heat dissipation plate 41, second heat dissipation plate 42 and bottom wall 32, capacitor 10a can be insulated from first heat dissipation plate 41, second heat dissipation plate 42 and bottom wall 32 without exterior case 13 and sealing resin 14. In power conversion device 100D, since a resin material having a higher thermal conductivity than sealing resin 14 can be used as sealing material 50, the heat generated by capacitor 10a can be efficiently transferred to case 30.

(Modification 1, Modification 2 and Modification 3 of Power Conversion Device 100D)

Figure 26:
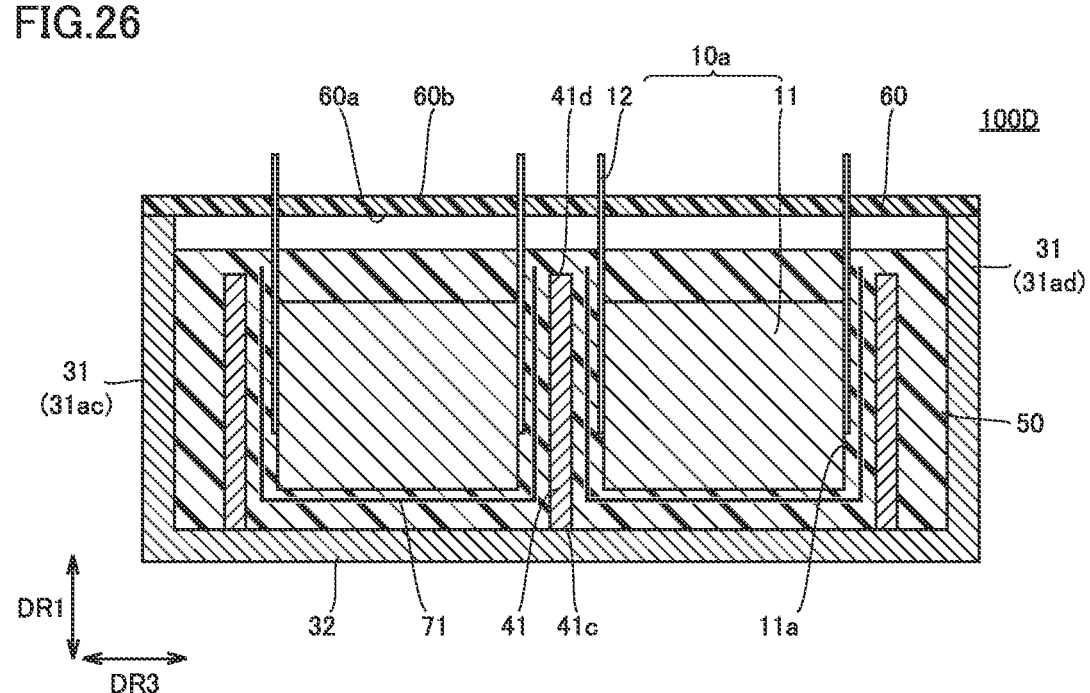
FIG. 26 is a cross-sectional view of Modification 1 of power conversion device 100D.

FIG. 26 is a cross-sectional view of Modification 1 of power conversion device 100D. FIG. 26 shows a cross section at a position corresponding to the line IV-IV in FIG. 2. As shown in FIG. 26, in power conversion device 100D, an insulating paper 71 may be used instead of insulating net 70. Insulating paper 71 is disposed in the space defined by two adjacent first heat dissipation plates 41, two adjacent second heat dissipation plates 42 and bottom wall 32, so as to surround capacitor 10a.

Figure 27:
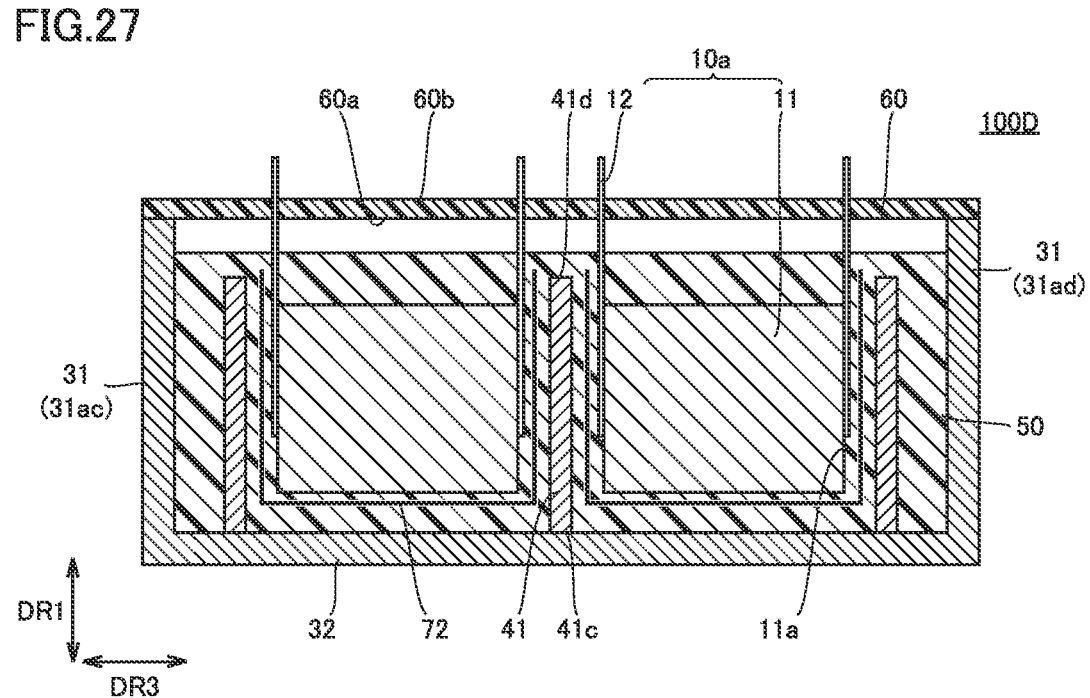
FIG. 27 is a cross-sectional view of Modification 2 of power conversion device 100D.

FIG. 27 is a cross-sectional view of Modification 2 of power conversion device 100D. FIG. 27 shows a cross section at a position corresponding to the line IV-IV in FIG. 2. As shown in FIG. 27, in power conversion device 100D, a thermally conductive insulating sheet 72 may be used instead of insulating net 70. Thermally conductive insulating sheet 72 is disposed in the space defined by two adjacent first heat dissipation plates 41, two adjacent second heat dissipation plates 42 and bottom wall 32.

Figure 28:
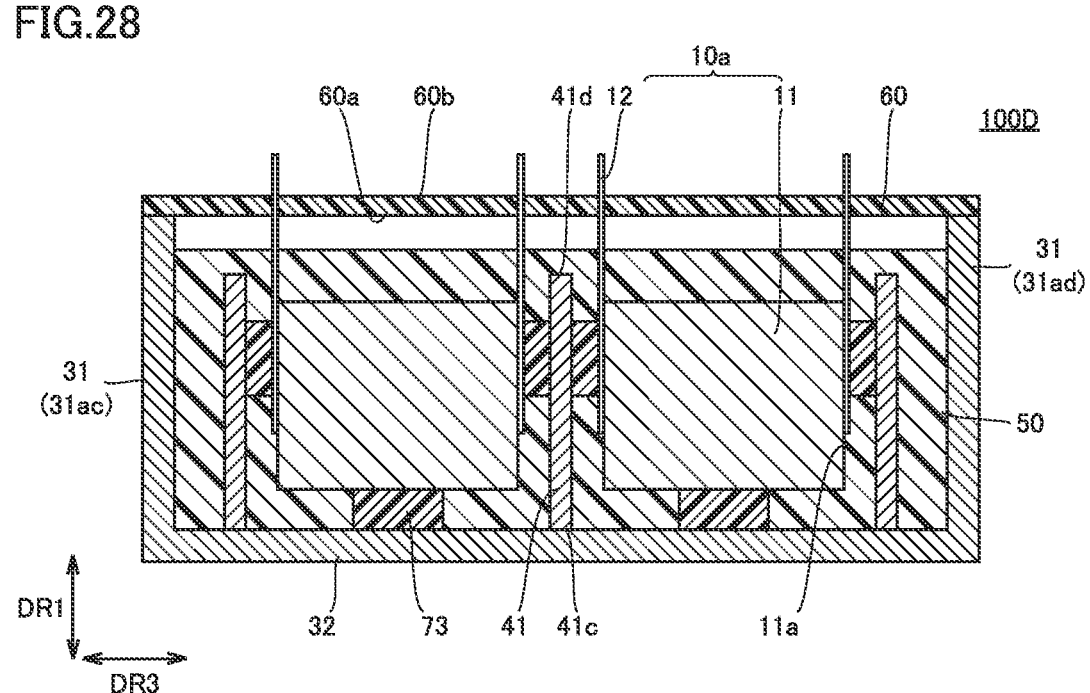
FIG. 28 is a cross-sectional view of Modification 3 of power conversion device 100D.

FIG. 28 is a cross-sectional view of Modification 3 of power conversion device 100D. FIG. 28 shows a cross section at a position corresponding to the line IV-IV in FIG. 2. As shown in FIG. 28, in power conversion device 100D, a spacer 73 may be used instead of insulating net 70. Spacer 73 is disposed between capacitor 10a and first heat dissipation plate 41, between capacitor 10a and second heat dissipation plate 42, and between capacitor 10a and bottom wall 32. Spacer 73 is made of a resin material, for example.

Again, in these cases, the contact between capacitor 10a and each of first heat dissipation plate 41, second heat dissipation plate 42 and bottom wall 32 is prevented by insulating paper 71, thermally conductive insulating sheet 72 or spacer 73, so that capacitor 10a can be insulated from first heat dissipation plate 41, second heat dissipation plate 42 and bottom wall 32.

(Modification 4 of Power Conversion Device 100D)

Figure 29:
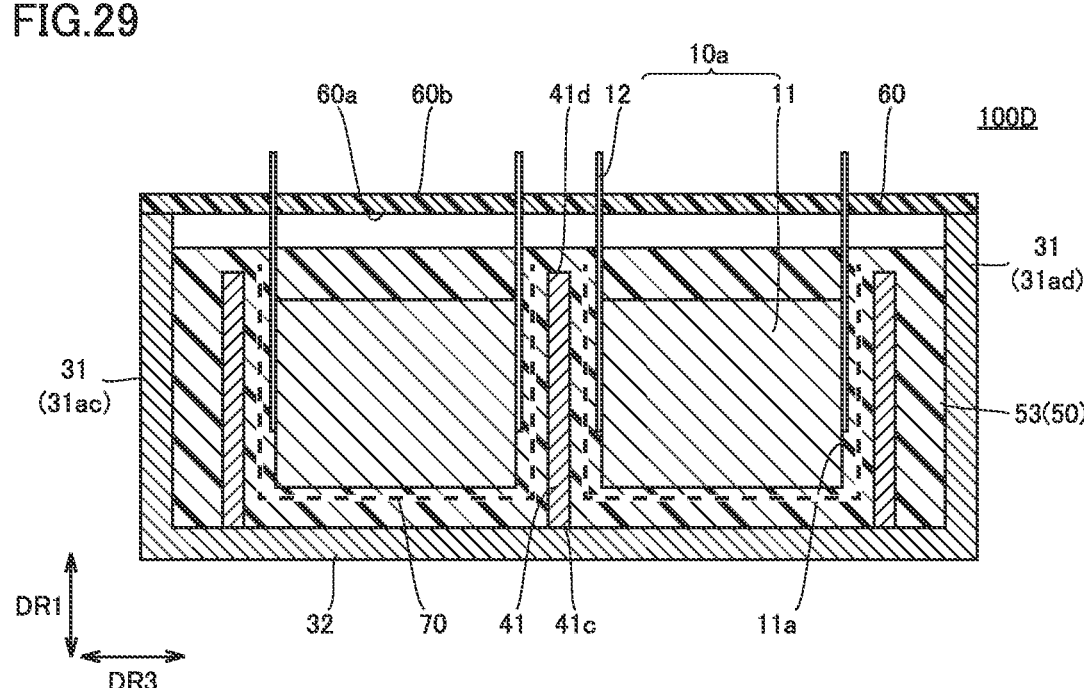
FIG. 29 is a cross-sectional view of Modification 4 of power conversion device 100D.

FIG. 29 is a cross-sectional view of Modification 4 of power conversion device 100D. FIG. 29 shows a cross section at a position corresponding to the line IV-IV in FIG. 2. As shown in FIG. 29, in power conversion device 100D, sealing material 50 may be silicone gel 53. Silicone gel 53 preferably has a low viscosity and high insulating properties.

Since silicone gel 53 adheres well to capacitor 10a, first heat dissipation plate 41 and second heat dissipation plate 42, there is no need to consider the creepage surface at a boundary with capacitor 10a, first heat dissipation plate 41 and second heat dissipation plate 42 when evaluating the insulating properties. In this case, therefore, an insulating area for ensuring the creepage distance is not required, which allows for downsizing around capacitor 10a. Particularly, in power conversion device 100D using insulating net 70, the use of silicone gel 53 can ensure high insulating properties, that is, high creepage dielectric strength and penetration dielectric strength.

Additionally, in this case, the heat generated by capacitor 10a can be efficiently transferred to case 30. Further, silicone gel 53 is a material having a high rate of penetration, that is, a soft material. In this case, therefore, the reliability can be improved when a heat cycle or a power cycle is applied to power conversion device 100. Note that since the position fixation of capacitor 10a is also performed by the attachment of printed wiring board 60 to case 30, the position fixation of capacitor 10a is not affected by the high rate of penetration of silicone gel 53.

Embodiment 6

A power conversion device according to Embodiment 6 is described. The power conversion device according to Embodiment 6 is referred to as a power conversion device 100E. In the following description, the differences from power conversion device 100 will be mainly described, and the same description will not be repeated.

(Configuration of Power Conversion Device 100E)

The configuration of power conversion device 100E is described below.

Power conversion device 100E includes the plurality of circuit components 10, case 30, the plurality of first heat dissipation plates 41, the plurality of second heat dissipation plates 42, sealing material 50, and printed wiring board 60. In this respect, the configuration of power conversion device 100E is the same as that of power conversion device 100.

Figure 30:
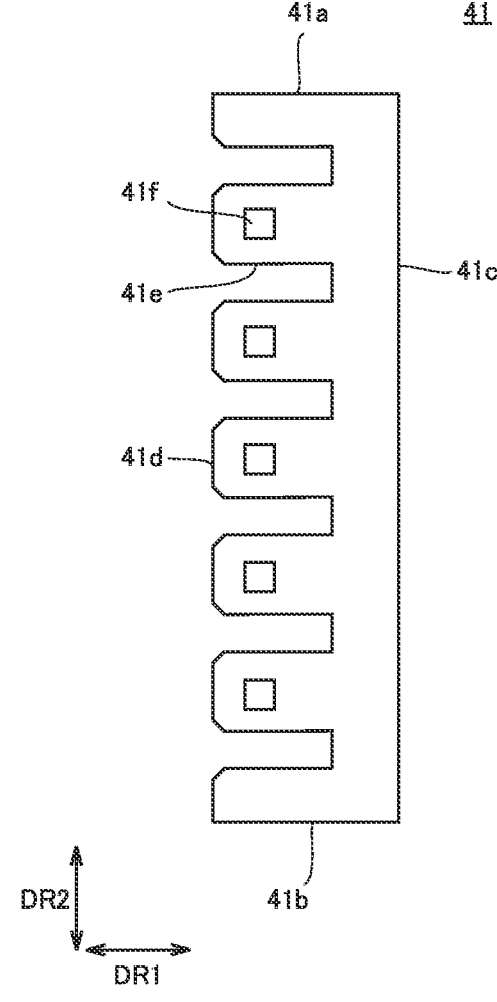
FIG. 30 is a side view of first heat dissipation plate 41 included in a power conversion device 100E.

FIG. 30 is a side view of first heat dissipation plate 41 included in power conversion device 100E. As shown in FIG. 30, in power conversion device 100E, first heat dissipation plate 41 is provided with a plurality of through holes 41f. Through hole 41f passes through first heat dissipation plate 41 in the thickness direction. The plurality of through holes 41f are spaced from one another in second direction DR2. Through hole 41f is disposed between two adjacent first insertion slots 41e. In power conversion device 100E, the width of first insertion slot 41e in second direction DR2 is larger than the thickness of second heat dissipation plate 42. More specifically, in power conversion device 100E, the width of first insertion slot 41e in second direction DR2 may be larger than the thickness of second heat dissipation plate 42 by 0.1 mm or more, and is preferably larger than the thickness of second heat dissipation plate 42 by 0.5 mm or more.

Figure 31:
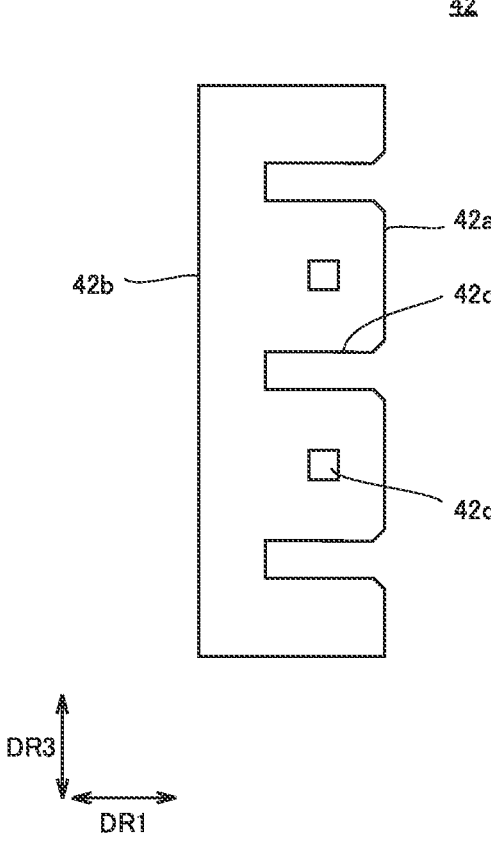
FIG. 31 is a side view of second heat dissipation plate 42 included in power conversion device 100E.

FIG. 31 is a side view of second heat dissipation plate 42 included in power conversion device 100E. As shown in FIG. 31, in power conversion device 100E, second heat dissipation plate 42 is provided with a plurality of through holes 42d. Through hole 42d passes through second heat dissipation plate 42 in the thickness direction. The plurality of through holes 42d are spaced from one another in third direction DR3. Through hole 42d is disposed between two adjacent second insertion slots 42c. In power conversion device 100E, the width of second insertion slot 42c in third direction DR3 is larger than the thickness of first heat dissipation plate 41. More specifically, in power conversion device 100E, the width of second insertion slot 42c in third direction DR3 may be larger than the thickness of first heat dissipation plate 41 by 0.1 mm or more, and is preferably larger than the thickness of first heat dissipation plate 41 by 0.5 mm or more.

Note that at least one of the following may be satisfied in power conversion device 100E: first heat dissipation plate 41 is provided with through hole 41f; second heat dissipation plate 42 is provided with through hole 42d; the width of first insertion slot 41e in second direction DR2 is sufficiently larger than the thickness of second heat dissipation plate 42; and the width of second insertion slot 42c in third direction DR3 is sufficiently larger than the thickness of first heat dissipation plate 41. In these respects, the configuration of power conversion device 100E is different from that of power conversion device 100.

Advantageous effects of power conversion device 100E are described below.

In power conversion device 100E, first heat dissipation plate 41 is provided with through hole 41f, and second heat dissipation plate 42 is provided with through hole 42d. Thus, sealing material 50 is readily injected through through hole 41f and through hole 42d into the space defined by two adjacent first heat dissipation plates 41, two adjacent second heat dissipation plates 42 and bottom wall 32. As a result, voids are less likely to form in sealing material 50 located in the space defined by two adjacent first heat dissipation plates 41, two adjacent second heat dissipation plates 42 and bottom wall 32. The absence of voids in sealing material 50 provides reduced thermal resistance of sealing material 50. In power conversion device 100E, therefore, the temperature rise in capacitor 10a can be further suppressed.

In power conversion device 100E, sealing material 50 is also present in through hole 41f and through hole 42d. In power conversion device 100E, therefore, the adhesion between sealing material 50 and each of first heat dissipation plate 41 and second heat dissipation plate 42 can be further improved. Additionally, in power conversion device 100E, as a result of the formation of through hole 41f and through hole 42d, the amount of material used to form first heat dissipation plate 41 and second heat dissipation plate 42 decreases, so that the manufacturing cost and weight of first heat dissipation plate 41 and second heat dissipation plate 42 can be reduced.

In power conversion device 100E, since the width of first insertion slot 41e in second direction DR2 is sufficiently larger than the thickness of second heat dissipation plate 42, and the width of second insertion slot 42c in third direction DR3 is sufficiently larger than the thickness of first heat dissipation plate 41, second heat dissipation plate 42 can be readily attached to first heat dissipation plate 41. According to power conversion device 100E, therefore, the assemblability can be improved.

Embodiment 7

A power conversion device according to Embodiment 7 is described. The power conversion device according to Embodiment 7 is referred to as a power conversion device 100F. In the following description, the differences from power conversion device 100 will be mainly described, and the same description will not be repeated.

(Configuration of Power Conversion Device 100F)

The configuration of power conversion device 100F is described below.

Power conversion device 100F includes the plurality of circuit components 10, case 30, the plurality of first heat dissipation plates 41, the plurality of second heat dissipation plates 42, sealing material 50, and printed wiring board 60. In this respect, the configuration of power conversion device 100F is the same as that of power conversion device 100.

Figure 32:
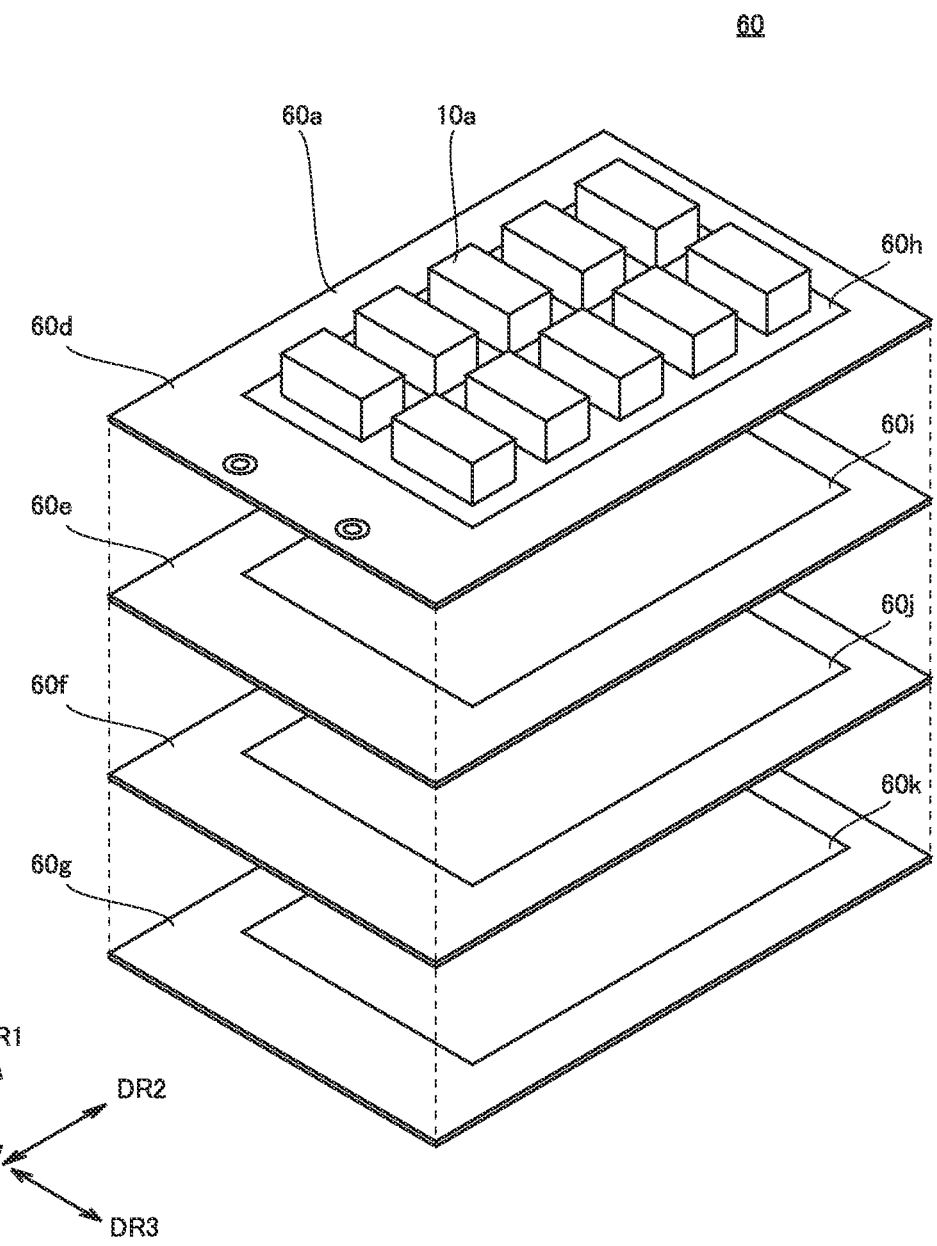
FIG. 32 is an exploded perspective view of printed wiring board 60 included in a power conversion device 100F.

FIG. 32 is an exploded perspective view of printed wiring board 60 included in power conversion device 100F. As shown in FIG. 32, in power conversion device 100F, printed wiring board 60 has a plurality of stacked layers. In the example shown in FIG. 32, printed wiring board 60 has a four-layered structure, which includes a first layer 60d, a second layer 60e, a third layer 60f and a fourth layer 60g. In power conversion device 100F, however, printed wiring board 60 is not limited to have the four-layered structure. Note that first layer 60d, second layer 60e, third layer 60f and fourth layer 60g are stacked in this order from first surface 60a toward second surface 60b.

In power conversion device 100F, each of the plurality of layers forming printed wiring board 60 has a wiring pattern. In the example shown in FIG. 32, the wiring patterns of first layer 60d, second layer 60e, third layer 60f and fourth layer 60g are a wiring pattern 60h, a wiring pattern 60i, a wiring pattern 60j and a wiring pattern 60k, respectively. A different potential is applied to wiring pattern 60h and wiring pattern 60j than a potential to wiring pattern 60i and wiring pattern 60j. For example, when a positive potential is applied to wiring pattern 60h and wiring pattern 60j, a negative potential is applied to wiring pattern 60i and wiring pattern 60j. Note that the wiring patterns adjacent to each other in the thickness direction of printed wiring board 60 are insulated from each other. Wiring pattern 60h is preferably disposed near the portion where side wall 31 and printed wiring board 60 are in contact with each other. In these respects, the configuration of power conversion device 100F is different from that of power conversion device 100.

(Advantageous Effects of Power Conversion Device 100F)

Advantageous effects of power conversion device 100F are described below.

In power conversion device 100F, since the wiring patterns of different potentials are alternately stacked, a stray capacitance is generated between the layers. As a result, a required capacitance of capacitor 10a can be supplemented by the stray capacitance of printed wiring board 60, so that the number of series or parallel capacitors 10a can be reduced. Additionally, in power conversion device 100F, since the wiring patterns of different potentials are disposed in parallel, inductance between the wiring patterns can be lowered. As a result, a surge voltage due to switching of switching circuit 120 can be reduced.

When an AC current flows through printed wiring board 60 during operation of power conversion device 100F, power consumption occurs due to a resistance component of printed wiring board 60, and printed wiring board 60 generates heat. In the example shown in FIG. 32, wiring pattern 60h, wiring pattern 60i, wiring pattern 60j and wiring pattern 60k generate heat. When wiring pattern 60h is disposed near the portion where side wall 31 and printed wiring board 60 are in contact with each other, the temperature rise in wiring pattern 60h can be suppressed.

Embodiment 8

A power conversion device according to Embodiment 8 is described. The power conversion device according to Embodiment 8 is referred to as a power conversion device 100G. In the following description, the differences from power conversion device 100 will be mainly described, and the same description will not be repeated.

(Configuration of Power Conversion Device 100G)

The configuration of power conversion device 100G is described below.

Power conversion device 100G includes the plurality of circuit components 10, case 30, the plurality of first heat dissipation plates 41, the plurality of second heat dissipation plates 42, sealing material 50, and printed wiring board 60. In this respect, the configuration of power conversion device 100G is the same as that of power conversion device 100.

Figure 33:
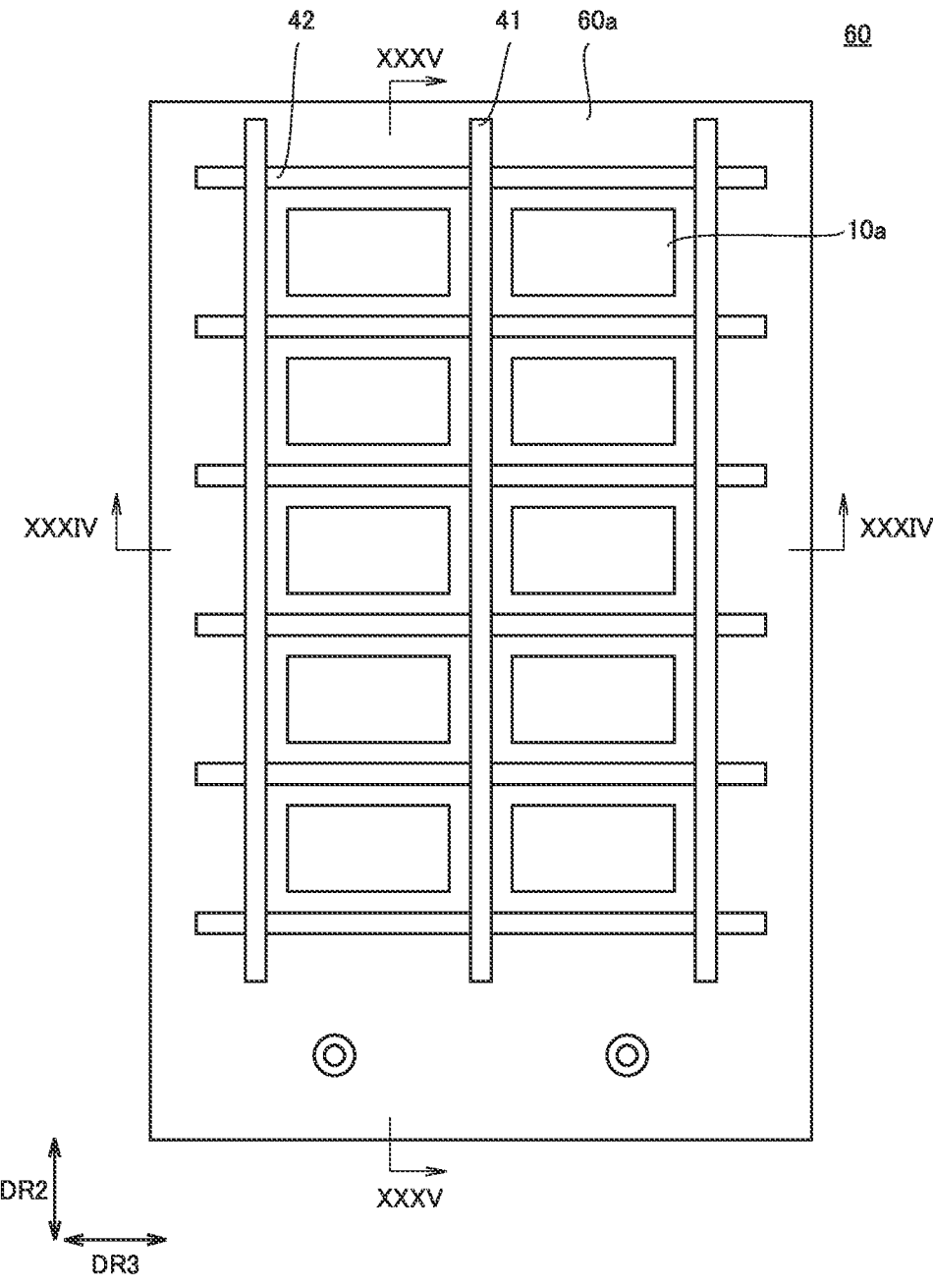
FIG. 33 is a bottom view of printed wiring board 60 included in a power conversion device 100G.
Figure 34:
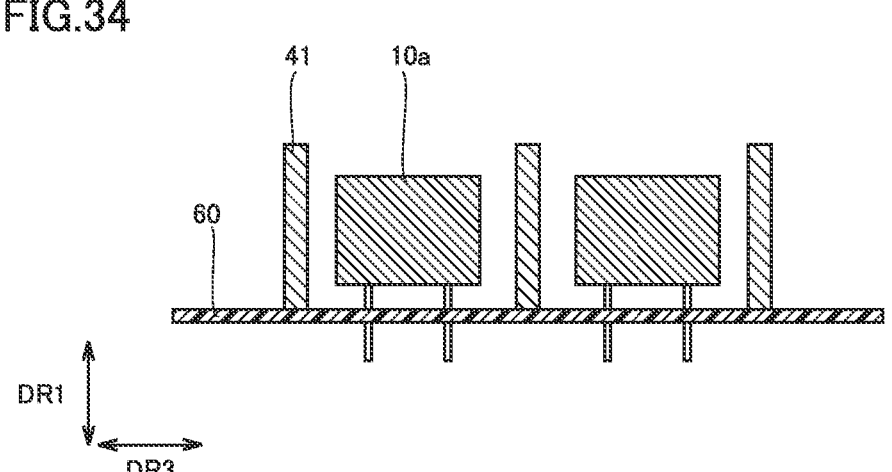
FIG. 34 is a schematic cross-sectional view along the line XXXIV-XXXIV in FIG. 33.
Figure 35:
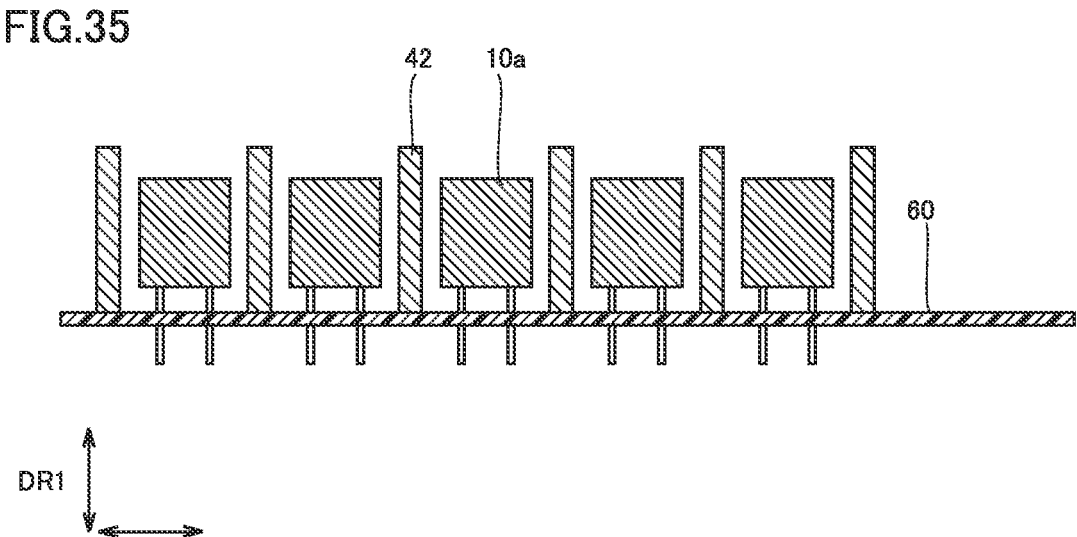
FIG. 35 is a schematic cross-sectional view along the line XXXV-XXXV in FIG. 33.

FIG. 33 is a bottom view of printed wiring board 60 included in power conversion device 100G. FIG. 34 is a schematic cross-sectional view along the line XXXIV-XXXIV in FIG. 33. FIG. 35 is a schematic cross-sectional view along the line XXXV-XXXV in FIG. 33. As shown in FIGS. 33 to 35, in power conversion device 100G, first heat dissipation plate 41 and second heat dissipation plate 42 are connected to printed wiring board 60. The connection of first heat dissipation plate 41 and second heat dissipation plate 42 to printed wiring board 60 is performed, for example, by soldering. In these respects, the configuration of power conversion device 100G is different from that of power conversion device 100.

(Method for Assembling Power Conversion Device 100G)

A method for assembling power conversion device 100G is described below.

In order to assemble power conversion device 100G, firstly, case 30, and printed wiring board 60 with the plurality of first heat dissipation plates 41, the plurality of second heat dissipation plates 42 and the plurality of capacitors 10a connected thereto are prepared. Secondly, sealing material 50 is injected into case 30. Thirdly, printed wiring board 60 with the plurality of first heat dissipation plates 41, the plurality of second heat dissipation plates 42 and the plurality of capacitors 10a connected thereto is attached to case 30. Fourthly, sealing material 50 is cured. The assembly of power conversion device 100G is thus completed.

(Advantageous Effects of Power Conversion Device 100G)

Advantageous effects of power conversion device 100G are described below.

In power conversion device 100G, since first heat dissipation plate 41 and second heat dissipation plate 42 are preconnected to printed wiring board 60, the assemblability of first heat dissipation plate 41 and second heat dissipation plate 42 to case 30 is improved. Additionally, in power conversion device 100G, the positioning accuracy of capacitor 10a, first heat dissipation plate 41 and second heat dissipation plate 42 is improved, so that the thickness of sealing material 50 can be decreased to reduce thermal resistance between capacitor 10a and each of first heat dissipation plate 41 and second heat dissipation plate 42.

Further, in power conversion device 100G, since first heat dissipation plate 41 and second heat dissipation plate 42 are connected to printed wiring board 60, heat generated by printed wiring board 60 is dissipated from case 30 through first heat dissipation plate 41 and second heat dissipation plate 42, so that the temperature rise in printed wiring board 60 can be suppressed, and the temperature of the entire power conversion device 100G can be equalized.

It should be understood that the embodiments disclosed herein are illustrative and non-restrictive in every respect. The basic scope of the present disclosure is defined by the scope of the claims, rather than the embodiments above, and is intended to include any modifications within the scope and meaning equivalent to the scope of the claims.

REFERENCE SIGNS LIST 100, 100A, 100B, 100C, 100D, 100E, 100F, 100G, 101, 102 power conversion device; 10 circuit component; 10a capacitor; 10b inductor; 10c contactor; 10d discharge resistor; 10e charge resistor; 11 capacitor element body; 11a electrode surface; 12 lead wire; 13 exterior case; 14 sealing resin; 20 circuit component; 20a, 20b, 20c, 20d, 20e, 20f transistor; 20g, 20h, 20i, 20j, 20k, 20l diode; 30 case; 31 side wall; 31a first side wall portion; 31aa first groove; 31ab, 31ac caulking groove; 31b second side wall portion; 31ba second groove; 31bb, 31bc caulking groove; 31c third side wall portion; 31d fourth side wall portion; 31e groove; 32 bottom wall; 32a third groove; 32b fourth groove; 32ca, 32cb caulking groove; 32da, 32db caulking groove; 32e fifth groove; 32ea, 32eb caulking groove; 33 brazing material; 34 plate member; 41 first heat dissipation plate; 41a first end; 41b second end; 41c third end; 41d fourth end; 41e first insertion slot; 41f through hole; 42 second heat dissipation plate; 42a fifth end; 42b sixth end; 42c second insertion slot; 42d through hole; 42e seventh end; 42f eighth end; 50 sealing material; 51 heat dissipation auxiliary material; 52 molding material; 53 silicone gel; 60 printed wiring board; 60a first surface; 60b second surface; 60c external connection terminal; 60d first layer; 60e second layer; 60f third layer; 60g fourth layer; 60h, 60i, 60j, 60k wiring pattern; 61 connection member; 70 insulating net; 71 insulating paper; 72 thermally conductive insulating sheet; 73 spacer; 110 peripheral circuit; 120 switching circuit; 130 DC supply circuit; 140 motor; 141, 142, 143 input line; DR1 first direction; DR2 second direction; DR3 third direction.

The invention claimed is:

1. A power conversion device comprising:

a case having a side wall and a bottom wall;

a plurality of first heat dissipation plates, a plurality of second heat dissipation plates, a plurality of circuit components and a sealing material that are disposed in the case; and a printed wiring board electrically connected to the plurality of circuit components and attached to the case, wherein an inner wall surface of the bottom wall has a normal along a first direction, the plurality of first heat dissipation plates each extend in a second direction orthogonal to the first direction, and are spaced from one another and arranged in a third direction orthogonal to the first direction and the second direction, the plurality of second heat dissipation plates each extend in the third direction, and are spaced from one another and arranged in the second direction, each of the plurality of circuit components is disposed in a space defined by two adjacent ones of the plurality of first heat dissipation plates, two adjacent ones of the plurality of second heat dissipation plates and the bottom wall, the sealing material fills the space, the side wall has a first side wall portion, and a second side wall portion facing the first side wall portion in the second direction, an inner wall surface of the first side wall portion is provided with a plurality of first grooves, the plurality of first grooves extending in the first direction and being spaced from one another in the third direction, an inner wall surface of the second side wall portion is provided with a plurality of second grooves, the plurality of second grooves extending in the first direction and being spaced from one another in the third direction, each of the plurality of first heat dissipation plates has a first end and a second end located opposite to the first end in the second direction, and the first end and the second end of each of the plurality of first heat dissipation plates are inserted into each of the plurality of first grooves and each of the plurality of second grooves, respectively.

2. The power conversion device according to claim 1, wherein each of the plurality of first heat dissipation plates has a third end located close to the bottom wall and a fourth end located opposite to the third end in the first direction, each of the plurality of first heat dissipation plates is provided with a plurality of first insertion slots, the plurality of first insertion slots extending from the fourth end toward the third end and being spaced from one another in the second direction, each of the plurality of second heat dissipation plates has a fifth end located close to the bottom wall and a sixth end located opposite to the fifth end in the first direction, each of the plurality of second heat dissipation plates is provided with a plurality of second insertion slots, the plurality of second insertion slots extending from the fifth end toward the sixth end and being spaced from one another in the third direction, and the plurality of second heat dissipation plates are attached to the plurality of first heat dissipation plates by each of the plurality of second insertion slots being inserted into each of the plurality of first insertion slots.

3. The power conversion device according to claim 1, wherein the sealing material includes a heat dissipation auxiliary material applied onto the bottom wall, and a molding material disposed on the heat dissipation auxiliary material so as to surround each of the plurality of circuit components.

4. The power conversion device according to claim 1, wherein each of the plurality of second heat dissipation plates has a seventh end and an eighth end located opposite to the seventh end in the third direction, and the sealing material is disposed between the seventh end and the case, and between the eighth end and the case.

5. The power conversion device according to claim 1, wherein the inner wall surface of the bottom wall is provided with a plurality of third grooves, the plurality of third grooves extending in the second direction and being spaced from one another in the third direction, and each of the plurality of first heat dissipation plates is inserted into each of the plurality of third grooves.

6. The power conversion device according to claim 5, wherein each of the plurality of first heat dissipation plates is bonded to each of the plurality of third grooves.

7. The power conversion device according to claim 1, wherein at least one of the plurality of first heat dissipation plates and the plurality of second heat dissipation plates is provided with a through hole.

8. The power conversion device according to claim 1, wherein each of the plurality of circuit components includes an element body having an electrode surface, a lead wire connected to the electrode surface, and an exterior case housing the element body, and each of the plurality of circuit components is disposed such that the electrode surface faces one of the plurality of first heat dissipation plates.

9. The power conversion device according to claim 8, wherein the plurality of circuit components include a plurality of first circuit components arranged in a first row in the second direction, and a plurality of second circuit components arranged in a second row in the second direction, the electrode surface of each of the plurality of first circuit components faces the electrode surface of each of the plurality of second circuit components, and one of the plurality of first heat dissipation plates is disposed between the first row and the second row.

10. The power conversion device according to claim 1, further comprising a plurality of insulating nets, wherein each of the plurality of circuit components includes an element body having an electrode surface, and a lead wire connected to the electrode surface, and each of the plurality of insulating nets is disposed to cover the element body of each of the plurality of circuit components.

11. The power conversion device according to claim 1, wherein the printed wiring board has a first surface facing the case, and a second surface located opposite to the first surface, and the printed wiring board has a first wiring pattern on the first surface, and a second wiring pattern which is stacked with the first wiring pattern and to which a different potential is applied than a potential to the first wiring pattern.

12. The power conversion device according to claim 1, wherein at least one of the plurality of first heat dissipation plates and the plurality of second heat dissipation plates is connected to the printed wiring board.

13. A power conversion device comprising:

a case having a side wall and a bottom wall;

a plurality of first heat dissipation plates, a plurality of second heat dissipation plates, a plurality of circuit components and a sealing material that are disposed in the case; and a printed wiring board electrically connected to the plurality of circuit components and attached to the case, wherein an inner wall surface of the bottom wall has a normal along a first direction, the plurality of first heat dissipation plates each extend in a second direction orthogonal to the first direction, and are spaced from one another and arranged in a third direction orthogonal to the first direction and the second direction, the plurality of second heat dissipation plates each extend in the third direction, and are spaced from one another and arranged in the second direction, each of the plurality of circuit components is disposed in a space defined by two adjacent ones of the plurality of first heat dissipation plates, two adjacent ones of the plurality of second heat dissipation plates and the bottom wall, the sealing material fills the space, each of the plurality of circuit components includes an element body having an electrode surface, a lead wire connected to the electrode surface, and an exterior case housing the element body, and each of the plurality of circuit components is disposed such that the electrode surface faces one of the plurality of first heat dissipation plates.

14. A power conversion device comprising:

a case having a side wall and a bottom wall;

a plurality of first heat dissipation plates, a plurality of second heat dissipation plates, a plurality of circuit components and a sealing material that are disposed in the case; and a printed wiring board electrically connected to the plurality of circuit components and attached to the case, wherein an inner wall surface of the bottom wall has a normal along a first direction, the plurality of first heat dissipation plates each extend in a second direction orthogonal to the first direction, and are spaced from one another and arranged in a third direction orthogonal to the first direction and the second direction, the plurality of second heat dissipation plates each extend in the third direction, and are spaced from one another and arranged in the second direction, each of the plurality of circuit components is disposed in a space defined by two adjacent ones of the plurality of first heat dissipation plates, two adjacent ones of the plurality of second heat dissipation plates and the bottom wall, the sealing material fills the space, the printed wiring board has a first surface facing the case, and a second surface located opposite to the first surface, and the printed wiring board has a first wiring pattern on the first surface, and a second wiring pattern which is stacked with the first wiring pattern and to which a different potential is applied than a potential to the first wiring pattern.

* * * * *